US012610506B2

(12) United States Patent
Lyon et al.

(10) Patent No.: US 12,610,506 B2
(45) Date of Patent: Apr. 21, 2026

(54) COOLING SYSTEMS, CONTROLLERS AND METHODS

(71) Applicant: CoolIT Systems, Inc., Calgary (CA)

(72) Inventors: Geoff Sean Lyon, Calgary (CA); Pat McGinn, Calgary (CA); Mike Holden, Calgary (CA); Brydon Gierl, Calgary (CA)

(73) Assignee: CoolIT Systems, Inc., Calgary (CA)

( * ) Notice: Subject to any disclaimer, the term of this patent is extended or adjusted under 35 U.S.C. 154(b) by 521 days.

(21) Appl. No.: 17/894,921

(22) Filed: Aug. 24, 2022

(65) Prior Publication Data

US 2022/0408615 A1 Dec. 22, 2022

Related U.S. Application Data

(63) Continuation of application No. 16/158,227, filed on Oct. 11, 2018, now Pat. No. 11,452,243.

(Continued)

(51) Int. Cl.
*H05K 7/20* (2006.01)
*F28F 27/00* (2006.01)
(Continued)

(52) U.S. Cl.
CPC ......... *H05K 7/20836* (2013.01); *F28F 27/00* (2013.01); *H05K 7/20272* (2013.01);
(Continued)

(58) Field of Classification Search
CPC ........... H05K 7/20836; H05K 7/20272; H05K 7/20781; F28F 27/00; F28F 23/02; F28F 2009/222; F28F 2250/08
See application file for complete search history.

(56) References Cited

U.S. PATENT DOCUMENTS 2,181,523 A 11/1939 Shiels
2,586,248 A 2/1952 Newman et al.
(Continued)

FOREIGN PATENT DOCUMENTS

CN 102252488 11/2011
CN 102483242 5/2012
(Continued)

OTHER PUBLICATIONS

"Refrigerador de CPUs WaterChill Antarctica Para Intel Socket 478, AMO Socket 462/754/939/940," Jun. 4, 2004 and Oct. 18, 2004, 9, pages, Version 4.0 & 4.1, Asetek, Inc. (Year: 2004).
(Continued)

*Primary Examiner* — Tho V Duong
(74) *Attorney, Agent, or Firm* — WORKMAN NYDEGGER

(57) ABSTRACT

Aspects of liquid operational systems are described. According to one aspect, a system to automatically fill a liquid operational component is described. According to another aspect, a self-diagnostic system is described. According to yet another aspect, a flow conditioning arrangement is described. A control system for a heat-transfer system includes a plurality of sensors. Each sensor is configured to observe an operational parameter indicative of a thermodynamic quantity and to emit a signal containing information corresponding to the observed operational parameter. Control logic includes a processing unit and instructions stored on a memory that, when executed by the processing unit, cause the control logic to determine a first thermodynamic quantity associated with each sensor from information contained in a signal from the respective sensor; determine a second thermodynamic quantity associated with each sensor from information contained in a signal received from at least one other sensor in the plurality of sensors; compare the first
(Continued)

thermodynamic quantity with the second thermodynamic quantity; and responsive to the comparison of the first thermodynamic quantity with the second thermodynamic quantity, output a control signal.

15 Claims, 16 Drawing Sheets

Related U.S. Application Data

(60) Provisional application No. 62/571,420, filed on Oct. 12, 2017.

(51) Int. Cl.
    *F28F 9/22*            (2006.01)
    *F28F 23/02*        (2006.01)

(52) U.S. Cl.
    CPC .... *H05K 7/20781* (2013.01); *F28F 2009/222* (2013.01); *F28F 23/02* (2013.01); *F28F 2250/08* (2013.01)

(56) References Cited

U.S. PATENT DOCUMENTS

| | | | |
|---|---|---|---|
| 2,620,815 A | 12/1952 | Margraf et al. | |
| 3,073,385 A | 1/1963 | Peters | |
| 3,481,393 A | 12/1969 | Chu | |
| 3,730,205 A | 5/1973 | Guimbellot | |
| 3,792,284 A | 2/1974 | Kaelin | |
| 3,817,321 A | 6/1974 | Von et al. | |
| 3,838,705 A | 10/1974 | Diehl et al. | |
| 3,861,826 A | 1/1975 | Dean, Jr. | |
| 3,888,098 A * | 6/1975 | Larrimer, Jr. .......... B21D 26/14 | |
| | | | 72/63 |
| 3,896,835 A | 7/1975 | Wicke | |
| 3,939,328 A | 2/1976 | Davis | |
| 4,060,997 A | 12/1977 | Shultz et al. | |
| 4,139,330 A | 2/1979 | Neal | |
| 4,181,610 A | 1/1980 | Shintani et al. | |
| 4,265,262 A * | 5/1981 | Hotine ..................... G05D 9/12 | |
| | | | 307/118 |
| 4,340,111 A | 7/1982 | Skala | |
| 4,345,643 A | 8/1982 | Dawson et al. | |
| 4,450,472 A | 5/1984 | Tuckerman et al. | |
| 4,488,566 A | 12/1984 | Hicks | |
| 4,495,777 A | 1/1985 | Babington | |
| 4,520,298 A | 5/1985 | Abbondanti | |
| 4,564,040 A | 1/1986 | Rudelick | |
| 4,750,086 A | 6/1988 | Mittal | |
| 4,758,926 A | 7/1988 | Herrell et al. | |
| 4,768,581 A | 9/1988 | Gotwald et al. | |
| 4,777,578 A | 10/1988 | Jahns | |
| 4,898,153 A | 2/1990 | Sherwood | |
| 4,909,315 A | 3/1990 | Nelson et al. | |
| 4,940,085 A | 7/1990 | Nelson et al. | |
| 5,016,090 A | 5/1991 | Galyon et al. | |
| 5,018,665 A | 5/1991 | Sulmone | |
| 5,070,936 A | 12/1991 | Carroll et al. | |
| 5,099,311 A | 3/1992 | Bonde et al. | |
| 5,142,214 A | 8/1992 | Purson et al. | |
| 5,203,401 A | 4/1993 | Hamburgen et al. | |
| 5,218,515 A | 6/1993 | Bernhardt | |
| 5,265,670 A | 11/1993 | Zingher | |
| 5,277,232 A | 1/1994 | Borsheim | |
| 5,294,830 A | 3/1994 | Young et al. | |
| 5,309,319 A | 5/1994 | Messina | |
| 5,441,102 A | 8/1995 | Burward-hoy | |
| 5,453,641 A | 9/1995 | Mundinger et al. | |
| 5,472,008 A | 12/1995 | Boarin | |
| 5,522,452 A | 6/1996 | Mizuno et al. | |
| 5,535,818 A | 7/1996 | Fujisaki et al. | |
| 5,542,445 A | 8/1996 | Adams | |
| 5,577,706 A | 11/1996 | King | |

| | | | |
|---|---|---|---|
| 5,592,363 A | 1/1997 | Atarashi et al. | |
| 5,628,199 A | 5/1997 | Hoglund et al. | |
| 5,636,653 A | 6/1997 | Titus | |
| 5,646,824 A | 7/1997 | Ohashi et al. | |
| 5,684,671 A | 11/1997 | Hobbs et al. | |
| 5,709,248 A | 1/1998 | Goloff | |
| 5,727,618 A | 3/1998 | Mundinger et al. | |
| 5,731,954 A | 3/1998 | Cheon | |
| 5,823,249 A | 10/1998 | Batchelder | |
| 5,835,347 A | 11/1998 | Chu | |
| 5,841,634 A | 11/1998 | Visser | |
| 5,864,464 A | 1/1999 | Lin | |
| 5,875,637 A | 3/1999 | Paetow | |
| 5,985,108 A | 11/1999 | Arai | |
| 5,998,240 A | 12/1999 | Hamilton et al. | |
| 6,019,165 A | 2/2000 | Batchelder | |
| 6,024,175 A | 2/2000 | Moore et al. | |
| 6,035,655 A | 3/2000 | Hare et al. | |
| 6,074,092 A | 6/2000 | Andrews | |
| 6,076,557 A | 6/2000 | Carney | |
| 6,135,718 A | 10/2000 | Yang | |
| 6,256,378 B1 | 7/2001 | Iggulden et al. | |
| 6,327,145 B1 | 12/2001 | Lian et al. | |
| 6,330,525 B1 | 12/2001 | Hays et al. | |
| 6,361,287 B1 | 3/2002 | Hopper | |
| 6,408,937 B1 | 6/2002 | Roy | |
| 6,415,853 B1 | 7/2002 | Tao et al. | |
| 6,415,860 B1 | 7/2002 | Kelly et al. | |
| 6,447,270 B1 | 9/2002 | Schmidt et al. | |
| 6,470,289 B1 | 10/2002 | Peters et al. | |
| 6,611,785 B1 | 8/2003 | Yamanaka et al. | |
| 6,679,315 B2 | 1/2004 | Cosley et al. | |
| 6,702,002 B2 | 3/2004 | Wang | |
| 6,725,682 B2 | 4/2004 | Scott | |
| 6,748,755 B2 | 6/2004 | Kubo et al. | |
| 6,769,258 B2 | 8/2004 | Pierson | |
| 6,775,137 B2 | 8/2004 | Chu et al. | |
| 6,792,373 B2 | 9/2004 | Tabor | |
| 6,807,056 B2 | 10/2004 | Kondo et al. | |
| 6,819,563 B1 | 11/2004 | Chu et al. | |
| 6,827,128 B2 | 12/2004 | Philpott et al. | |
| 6,868,682 B2 | 3/2005 | Sharma et al. | |
| 6,883,347 B2 | 4/2005 | Ayub | |
| 6,896,066 B2 | 5/2005 | Gil | |
| 6,896,612 B1 | 5/2005 | Novotny | |
| 6,900,990 B2 | 5/2005 | Tomioka | |
| 6,952,345 B2 | 10/2005 | Weber et al. | |
| 6,970,355 B2 | 11/2005 | Ellsworth, Jr. et al. | |
| 6,973,801 B1 | 12/2005 | Campbell et al. | |
| 6,986,382 B2 | 1/2006 | Upadhya et al. | |
| 6,988,534 B2 | 1/2006 | Kenny et al. | |
| 6,993,421 B2 | 1/2006 | Pillar et al. | |
| 7,000,684 B2 | 2/2006 | Kenny et al. | |
| 7,007,506 B2 | 3/2006 | Kubo et al. | |
| 7,012,807 B2 | 3/2006 | Chu et al. | |
| 7,021,367 B2 | 4/2006 | Oikawa | |
| 7,029,647 B2 | 4/2006 | Tonkovich et al. | |
| 7,032,651 B2 | 4/2006 | Winslow et al. | |
| 7,044,198 B2 | 5/2006 | Matsushima et al. | |
| 7,051,946 B2 | 5/2006 | Bash et al. | |
| 7,055,581 B1 | 6/2006 | Roy | |
| 7,057,893 B2 | 6/2006 | Nicolai et al. | |
| 7,086,247 B2 | 8/2006 | Campbell et al. | |
| 7,104,312 B2 | 9/2006 | Goodson et al. | |
| 7,123,996 B2 | 10/2006 | Fukushima et al. | |
| 7,124,811 B2 | 10/2006 | Crocker et al. | |
| 7,131,486 B2 | 11/2006 | Goodson et al. | |
| 7,143,816 B1 | 12/2006 | Ghosh et al. | |
| 7,149,084 B2 | 12/2006 | Matsushima et al. | |
| 7,156,159 B2 | 1/2007 | Lovette et al. | |
| 7,174,738 B2 | 2/2007 | Scott | |
| 7,190,580 B2 | 3/2007 | Bezama et al. | |
| 7,201,217 B2 | 4/2007 | Johnson et al. | |
| 7,206,203 B2 | 4/2007 | Campbell et al. | |
| 7,209,355 B2 | 4/2007 | Koga et al. | |
| 7,221,270 B2 | 5/2007 | Chen et al. | |
| 7,248,006 B2 | 7/2007 | Bailey et al. | |
| 7,259,963 B2 | 8/2007 | Germagian et al. | |
| 7,259,965 B2 | 8/2007 | Chang et al. | |

(56) References Cited

U.S. PATENT DOCUMENTS

| | | | |
|---|---|---|---|
| 7,264,359 | B2 | 9/2007 | Kawahara et al. |
| 7,274,566 | B2 | 9/2007 | Campbell et al. |
| 7,278,273 | B1 | 10/2007 | Whitted et al. |
| 7,301,771 | B2 | 11/2007 | Hata et al. |
| 7,313,461 | B2 | 12/2007 | Sharma et al. |
| 7,313,924 | B2 | 1/2008 | Bash et al. |
| 7,315,448 | B1 | 1/2008 | Bash et al. |
| 7,318,322 | B2 | 1/2008 | Ota et al. |
| 7,331,378 | B2 | 2/2008 | Bhatti et al. |
| 7,360,582 | B2 | 4/2008 | Olesen |
| 7,397,661 | B2 | 7/2008 | Campbell et al. |
| 7,405,935 | B1 | 7/2008 | Carey |
| 7,420,804 | B2 | 9/2008 | Leija et al. |
| 7,436,666 | B1 | 10/2008 | Konshak |
| 7,438,124 | B2 | 10/2008 | Bhatti et al. |
| 7,455,103 | B2 | 11/2008 | Sato et al. |
| 7,466,549 | B2 | 12/2008 | Doerrich et al. |
| 7,466,553 | B2 | 12/2008 | Hamman |
| 7,484,530 | B2 | 2/2009 | Harvey et al. |
| 7,486,513 | B2 | 2/2009 | Hall et al. |
| 7,525,207 | B2 | 4/2009 | Clidaras et al. |
| 7,527,085 | B2 | 5/2009 | Iijima et al. |
| 7,591,302 | B1 | 9/2009 | Lenehan et al. |
| 7,599,184 | B2 | 10/2009 | Upadhya et al. |
| 7,630,795 | B2 | 12/2009 | Campbell et al. |
| 7,639,499 | B1 | 12/2009 | Campbell et al. |
| 7,688,589 | B2 | 3/2010 | Chiang |
| 7,756,667 | B2 | 7/2010 | Hamann et al. |
| 7,757,506 | B2 | 7/2010 | Ellsworth, Jr. et al. |
| 7,762,314 | B2 | 7/2010 | Campbell et al. |
| 7,791,882 | B2 | 9/2010 | Chu et al. |
| 7,806,168 | B2 | 10/2010 | Upadhya et al. |
| 7,874,171 | B2 | 1/2011 | Park |
| 7,905,106 | B2 | 3/2011 | Attlesey et al. |
| 7,909,262 | B2 | 3/2011 | Efeld et al. |
| 7,925,746 | B1 | 4/2011 | Melton |
| 7,944,694 | B2 | 5/2011 | Campbell et al. |
| 7,957,132 | B2 | 6/2011 | Fried |
| 7,957,144 | B2 | 6/2011 | Goettert et al. |
| 7,961,465 | B2 | 6/2011 | Goldrian et al. |
| 7,969,727 | B2 | 6/2011 | Tozer et al. |
| 7,971,632 | B2 | 7/2011 | Eriksen |
| 7,978,472 | B2 | 7/2011 | Campbell et al. |
| 7,995,339 | B2 | 8/2011 | Bash et al. |
| 8,051,898 | B2 | 11/2011 | Chiang |
| 8,066,057 | B2 | 11/2011 | Olesen |
| 8,094,453 | B2 | 1/2012 | Campbell et al. |
| 8,240,362 | B2 | 8/2012 | Eriksen |
| 8,245,764 | B2 | 8/2012 | Eriksen |
| 8,250,879 | B2 | 8/2012 | Macbain et al. |
| 8,274,787 | B2 | 9/2012 | Alyaser et al. |
| 8,289,710 | B2 | 10/2012 | Spearing et al. |
| 8,418,487 | B2 | 4/2013 | King |
| 8,427,831 | B2 | 4/2013 | Wei |
| 8,430,156 | B2 * | 4/2013 | Malone .............. H01L 23/473 165/300 |
| 8,437,129 | B2 | 5/2013 | Tung et al. |
| 8,441,789 | B2 | 5/2013 | Wu et al. |
| 8,493,735 | B2 | 7/2013 | Iijima |
| 8,493,738 | B2 | 7/2013 | Chainer et al. |
| 8,499,761 | B2 | 8/2013 | Jorczak et al. |
| 8,631,860 | B2 | 1/2014 | Tang et al. |
| 8,687,364 | B2 | 4/2014 | Chainer et al. |
| 8,724,315 | B2 | 5/2014 | Branton |
| 8,746,330 | B2 | 6/2014 | Lyon |
| 8,749,968 | B1 | 6/2014 | Branton |
| 8,817,474 | B2 | 8/2014 | Campbell et al. |
| 9,043,035 | B2 | 5/2015 | Chainer et al. |
| 9,052,252 | B2 | 6/2015 | Lyon et al. |
| 9,057,567 | B2 | 6/2015 | Lyon |
| 9,069,532 | B2 | 6/2015 | Campbell et al. |
| 9,215,832 | B2 | 12/2015 | Chang et al. |
| 9,380,735 | B2 | 6/2016 | Chang |
| 9,453,691 | B2 | 9/2016 | Lyon |
| 9,496,200 | B2 | 11/2016 | Lyon et al. |
| 9,603,284 | B2 | 3/2017 | Lyon |
| 9,723,745 | B2 | 8/2017 | Qi et al. |
| 9,733,681 | B2 | 8/2017 | Eriksen |
| 10,197,176 | B2 | 2/2019 | Hathaway et al. |
| 10,335,230 | B2 | 7/2019 | Willyard et al. |
| 10,364,809 | B2 | 7/2019 | Lyon et al. |
| 10,365,667 | B2 | 7/2019 | Lyon et al. |
| 10,690,423 | B2 | 6/2020 | Kallosoe et al. |
| 11,661,936 | B2 | 5/2023 | Lyon et al. |
| 2002/0070007 | A1 | 6/2002 | Calaman et al. |
| 2002/0153885 | A1 | 10/2002 | Blossfeld |
| 2002/0189790 | A1 | 12/2002 | Wong |
| 2003/0010379 | A1 | 1/2003 | Kleiner et al. |
| 2003/0019234 | A1 | 1/2003 | Wayburn et al. |
| 2003/0070792 | A1 | 4/2003 | Tanaka et al. |
| 2003/0085028 | A1 | 5/2003 | Galtz |
| 2003/0151130 | A1 | 8/2003 | Cheon |
| 2003/0173839 | A1 | 9/2003 | Torii et al. |
| 2003/0230400 | A1 | 12/2003 | McCordic et al. |
| 2004/0008113 | A1 | 1/2004 | Pradhan et al. |
| 2004/0008483 | A1 | 1/2004 | Cheon |
| 2004/0016241 | A1 | 1/2004 | Street et al. |
| 2004/0040695 | A1 | 3/2004 | Chesser et al. |
| 2004/0042171 | A1 | 3/2004 | Takamatsu et al. |
| 2004/0042172 | A1 | 3/2004 | Kusaka et al. |
| 2004/0057211 | A1 | 3/2004 | Kondo et al. |
| 2004/0095721 | A1 | 5/2004 | Ellsworth et al. |
| 2004/0100770 | A1 | 5/2004 | Chu et al. |
| 2004/0104010 | A1 | 6/2004 | Kenny et al. |
| 2004/0104012 | A1 | 6/2004 | Zhou et al. |
| 2004/0104022 | A1 | 6/2004 | Kenny et al. |
| 2004/0112585 | A1 | 6/2004 | Goodson et al. |
| 2004/0123614 | A1 | 7/2004 | Stewart |
| 2004/0160741 | A1 | 8/2004 | Moss et al. |
| 2004/0182548 | A1 | 9/2004 | Lovette et al. |
| 2004/0182560 | A1 | 9/2004 | Kenny et al. |
| 2004/0188066 | A1 | 9/2004 | Upadhya et al. |
| 2004/0188069 | A1 | 9/2004 | Tomioka et al. |
| 2004/0206477 | A1 | 10/2004 | Kenny et al. |
| 2004/0221604 | A1 | 11/2004 | Ota et al. |
| 2004/0240179 | A1 | 12/2004 | Koga et al. |
| 2004/0243280 | A1 | 12/2004 | Bash et al. |
| 2005/0069432 | A1 | 3/2005 | Tomioka |
| 2005/0111187 | A1 | 5/2005 | Berens et al. |
| 2005/0126747 | A1 | 6/2005 | Chu et al. |
| 2005/0128705 | A1 | 6/2005 | Chu et al. |
| 2005/0162280 | A1 | 7/2005 | Hayashida et al. |
| 2005/0178531 | A1 | 8/2005 | Huang et al. |
| 2005/0180107 | A1 | 8/2005 | Naganawa et al. |
| 2005/0205241 | A1 | 9/2005 | Goodson et al. |
| 2005/0211417 | A1 | 9/2005 | Upadhya et al. |
| 2005/0241809 | A1 | 11/2005 | Tomioka et al. |
| 2005/0259397 | A1 | 11/2005 | Bash et al. |
| 2005/0269061 | A1 | 12/2005 | Brewer et al. |
| 2005/0274115 | A1 | 12/2005 | Pearce |
| 2006/0002080 | A1 | 1/2006 | Leija et al. |
| 2006/0002088 | A1 | 1/2006 | Bezama et al. |
| 2006/0011329 | A1 | 1/2006 | Wang et al. |
| 2006/0094347 | A1 | 5/2006 | Tracy et al. |
| 2006/0096305 | A1 | 5/2006 | Hanzawa et al. |
| 2006/0096738 | A1 | 5/2006 | Kang et al. |
| 2006/0096740 | A1 | 5/2006 | Zheng |
| 2006/0096743 | A1 | 5/2006 | Lee et al. |
| 2006/0126293 | A1 | 6/2006 | Campbell et al. |
| 2006/0137863 | A1 | 6/2006 | Lee et al. |
| 2006/0143439 | A1 | 6/2006 | Arumugam et al. |
| 2006/0162903 | A1 | 7/2006 | Bhatti et al. |
| 2006/0168975 | A1 | 8/2006 | Malone et al. |
| 2006/0171538 | A1 | 8/2006 | Larson et al. |
| 2006/0171801 | A1 | 8/2006 | Manabe et al. |
| 2006/0178616 | A1 | 8/2006 | Hartman et al. |
| 2006/0185829 | A1 | 8/2006 | Duan et al. |
| 2006/0185830 | A1 | 8/2006 | Duan et al. |
| 2006/0187638 | A1 | 8/2006 | Vinson et al. |
| 2006/0225867 | A1 | 10/2006 | Park et al. |
| 2006/0231238 | A1 | 10/2006 | Ball, Jr. |
| 2006/0248159 | A1 | 11/2006 | Polan |
| 2006/0254755 | A1 | 11/2006 | Chen et al. |
| 2007/0029069 | A1 | 2/2007 | Duan |

(56) References Cited

U.S. PATENT DOCUMENTS

| | | |
|---|---|---|
| 2007/0032979 A1 | 2/2007 | Hamann et al. |
| 2007/0034356 A1 | 2/2007 | Kenny et al. |
| 2007/0039719 A1 | 2/2007 | Eriksen |
| 2007/0078635 A1 | 4/2007 | Rasmussen et al. |
| 2007/0095512 A1 | 5/2007 | Chen et al. |
| 2007/0107886 A1 | 5/2007 | Chen |
| 2007/0125526 A1 | 6/2007 | Satou et al. |
| 2007/0131396 A1 | 6/2007 | Yu et al. |
| 2007/0163750 A1 | 7/2007 | Bhatti et al. |
| 2007/0193724 A1 | 8/2007 | Lin |
| 2007/0209784 A1 | 9/2007 | Peng |
| 2007/0227704 A1 | 10/2007 | Nagai et al. |
| 2007/0227710 A1 | 10/2007 | Belady et al. |
| 2007/0256957 A1 | 11/2007 | Herrmann et al. |
| 2007/0272314 A1 | 11/2007 | Packham |
| 2007/0272392 A1 | 11/2007 | Ghosh et al. |
| 2007/0297136 A1 | 12/2007 | Konshak |
| 2008/0029250 A1 | 2/2008 | Carlson et al. |
| 2008/0041792 A1 | 2/2008 | Crnkovich |
| 2008/0053641 A1 | 3/2008 | Lai et al. |
| 2008/0068793 A1 | 3/2008 | Ishimine |
| 2008/0128114 A1 | 6/2008 | Lai et al. |
| 2008/0165499 A1 | 7/2008 | Campbell et al. |
| 2008/0179045 A1 | 7/2008 | Hu et al. |
| 2008/0186670 A1 | 8/2008 | Lyon et al. |
| 2008/0205003 A1 | 8/2008 | Belady |
| 2008/0225478 A1 | 9/2008 | Goettert et al. |
| 2008/0266726 A1 | 10/2008 | Murakami et al. |
| 2008/0288124 A1 | 11/2008 | Huang |
| 2008/0289695 A1 | 11/2008 | Holzer et al. |
| 2008/0301941 A1 | 12/2008 | Anderson et al. |
| 2008/0304236 A1 | 12/2008 | Murakami et al. |
| 2008/0314367 A1 | 12/2008 | Goulette et al. |
| 2009/0027856 A1 | 1/2009 | McCoy |
| 2009/0056910 A1 | 3/2009 | Mallia et al. |
| 2009/0071625 A1 | 3/2009 | Lyon |
| 2009/0086434 A1 | 4/2009 | Hodes et al. |
| 2009/0101315 A1 | 4/2009 | Cheng |
| 2009/0120622 A1 | 5/2009 | Koch |
| 2009/0126910 A1 | 5/2009 | Campbell et al. |
| 2009/0139698 A1 | 6/2009 | Robinson |
| 2009/0154096 A1 | 6/2009 | Iyengar et al. |
| 2009/0199580 A1 | 8/2009 | Lyon |
| 2009/0199582 A1 | 8/2009 | Justin |
| 2009/0228893 A1 | 9/2009 | Behrendt et al. |
| 2009/0260777 A1 | 10/2009 | Attlesey |
| 2009/0306833 A1 | 12/2009 | Vinson et al. |
| 2009/0322543 A1 | 12/2009 | Crnkovich et al. |
| 2010/0012294 A1 | 1/2010 | Bezama et al. |
| 2010/0032142 A1 | 2/2010 | Copeland et al. |
| 2010/0065355 A1 | 3/2010 | Reddy |
| 2010/0085708 A1 | 4/2010 | Martin et al. |
| 2010/0101765 A1 | 4/2010 | Campbell et al. |
| 2010/0103619 A1 | 4/2010 | Refai-Ahmed et al. |
| 2010/0103620 A1 | 4/2010 | Campbell et al. |
| 2010/0106464 A1 | 4/2010 | Hlasny et al. |
| 2010/0139887 A1 | 6/2010 | Slessman |
| 2010/0170582 A1 | 7/2010 | Koba et al. |
| 2010/0179695 A1 | 7/2010 | Collins et al. |
| 2010/0182809 A1 | 7/2010 | Cullinane et al. |
| 2010/0206869 A1 | 8/2010 | Nelson et al. |
| 2010/0211669 A1 | 8/2010 | Dalgas et al. |
| 2010/0236772 A1* | 9/2010 | Novotny ............. H05K 7/20836 |
| | | 165/287 |
| 2010/0313576 A1 | 12/2010 | Goenka |
| 2010/0324962 A1 | 12/2010 | Nesler et al. |
| 2010/0326634 A1 | 12/2010 | Eriksen |
| 2011/0008153 A1 | 1/2011 | Kato et al. |
| 2011/0084839 A1 | 4/2011 | Groth et al. |
| 2011/0100045 A1 | 5/2011 | Carlson |
| 2011/0100618 A1 | 5/2011 | Carlson |
| 2011/0115223 A1 | 5/2011 | Stahlkopf et al. |
| 2011/0127027 A1 | 6/2011 | Kashirajima et al. |
| 2011/0154842 A1 | 6/2011 | Heydari et al. |
| 2011/0162742 A1 | 7/2011 | Ulens et al. |

| | | |
|---|---|---|
| 2011/0168379 A1 | 7/2011 | Morgan et al. |
| 2011/0174001 A1 | 7/2011 | Carlson et al. |
| 2011/0175498 A1 | 7/2011 | Bash et al. |
| 2011/0303394 A1 | 12/2011 | Branton |
| 2011/0313576 A1 | 12/2011 | Nicewonger |
| 2011/0315407 A1 | 12/2011 | Park et al. |
| 2011/0317367 A1 | 12/2011 | Campbell et al. |
| 2012/0014068 A1 | 1/2012 | Nakanishi et al. |
| 2012/0103009 A1 | 5/2012 | Ding et al. |
| 2012/0147553 A1 | 6/2012 | Eriksen |
| 2012/0152498 A1 | 6/2012 | Lyon |
| 2012/0175094 A1 | 7/2012 | Rice |
| 2012/0176745 A1 | 7/2012 | Helberg et al. |
| 2012/0186790 A1 | 7/2012 | Delia et al. |
| 2012/0271567 A1 | 10/2012 | Da Pont et al. |
| 2012/0273159 A1 | 11/2012 | Eriksen |
| 2012/0300391 A1 | 11/2012 | Keisling et al. |
| 2013/0025818 A1 | 1/2013 | Lyon et al. |
| 2013/0027884 A1 | 1/2013 | Campbell et al. |
| 2013/0068674 A1 | 3/2013 | Manabe et al. |
| 2013/0091883 A1 | 4/2013 | Perez et al. |
| 2013/0092258 A1 | 4/2013 | Yasuda et al. |
| 2013/0107453 A1 | 5/2013 | Chainer et al. |
| 2013/0184927 A1 | 7/2013 | Daniel et al. |
| 2013/0203032 A1 | 8/2013 | Bardsley et al. |
| 2013/0206359 A1 | 8/2013 | Bertilsson et al. |
| 2013/0277008 A1 | 10/2013 | Ishikura et al. |
| 2013/0288630 A1 | 10/2013 | Suzuki |
| 2013/0340843 A1 | 12/2013 | Gilmer |
| 2013/0340995 A1 | 12/2013 | David et al. |
| 2014/0018615 A1 | 1/2014 | Lee |
| 2014/0049918 A1* | 2/2014 | Chainer ............. H05K 7/20836 |
| | | 361/702 |
| 2014/0069111 A1 | 3/2014 | Campbell et al. |
| 2014/0103950 A1 | 4/2014 | Janitch |
| 2014/0126147 A1 | 5/2014 | Chen |
| 2014/0141162 A1 | 5/2014 | Wolff et al. |
| 2014/0147289 A1 | 5/2014 | Tian et al. |
| 2014/0158326 A1 | 6/2014 | Lyon |
| 2014/0186156 A1 | 7/2014 | Lai et al. |
| 2014/0245708 A1 | 9/2014 | Kawabe et al. |
| 2014/0251582 A1 | 9/2014 | Lyon |
| 2014/0262180 A1 | 9/2014 | Lyon et al. |
| 2014/0266744 A1 | 9/2014 | Lyon et al. |
| 2014/0332195 A1 | 11/2014 | Liberman |
| 2015/0083368 A1 | 3/2015 | Lyon |
| 2015/0108934 A1 | 4/2015 | Wong et al. |
| 2015/0166362 A1 | 6/2015 | Govindan et al. |
| 2015/0168474 A1 | 6/2015 | Yoshioka et al. |
| 2015/0176931 A1 | 6/2015 | Aeberhard et al. |
| 2015/0355630 A1 | 12/2015 | Cader et al. |
| 2016/0281704 A1 | 9/2016 | Lyon et al. |
| 2016/0290216 A1 | 10/2016 | Katragadda et al. |
| 2016/0377355 A1 | 12/2016 | Lyon |
| 2017/0030228 A1 | 2/2017 | Jordan, Jr. et al. |
| 2017/0064874 A1 | 3/2017 | Lyon et al. |
| 2017/0068258 A1 | 3/2017 | Lyon et al. |
| 2017/0147289 A1 | 5/2017 | Exall et al. |
| 2017/0196116 A1 | 7/2017 | Lyon |
| 2017/0219241 A1 | 8/2017 | Magcale et al. |
| 2019/0039437 A1 | 2/2019 | Jentz et al. |
| 2019/0116694 A1 | 4/2019 | Lyon et al. |
| 2019/0353370 A1 | 11/2019 | Hern et al. |
| 2019/0354121 A1 | 11/2019 | Lyon et al. |
| 2019/0368832 A1 | 12/2019 | Huang et al. |
| 2020/0004156 A1 | 1/2020 | Hsieh et al. |
| 2020/0025641 A1 | 1/2020 | Long et al. |
| 2020/0271237 A1 | 8/2020 | Srinivasa |
| 2020/0348202 A1 | 11/2020 | Farkas et al. |

FOREIGN PATENT DOCUMENTS

| | | |
|---|---|---|
| CN | 103419937 | 12/2013 |
| CN | 106958978 | 7/2017 |
| CN | 206930036 | 1/2018 |
| CN | 207702811 | 8/2018 |
| CN | 109752624 A | 5/2019 |
| CN | 111736673 A | 10/2020 |
| DE | 202012002974 | 7/2012 |

(56) References Cited

FOREIGN PATENT DOCUMENTS

| | | | | | |
|----|----------------|------|---------|--------|--------------|
| EP | 1333518 | A1 * | 8/2003 | ........ | H01M 8/04044 |
| EP | 1808892 | | 7/2007 | | |
| JP | 61032449 | | 2/1986 | | |
| JP | H02287076 | | 11/1990 | | |
| JP | 03-017443 | A | 1/1991 | | |
| JP | 06120387 | | 4/1994 | | |
| JP | 07183678 | | 7/1995 | | |
| JP | 09292099 | | 11/1997 | | |
| JP | 10173114 | | 6/1998 | | |
| JP | H11316075 | | 11/1999 | | |
| JP | 2001255027 | | 9/2001 | | |
| JP | 2002151638 | | 5/2002 | | |
| JP | 2003243581 | | 8/2003 | | |
| JP | 2005351600 | | 12/2005 | | |
| JP | 2007227902 | | 6/2007 | | |
| JP | 2007180505 | | 7/2007 | | |
| JP | 2007531991 | | 9/2007 | | |
| JP | 2008140879 | | 6/2008 | | |
| JP | 2009529621 | | 8/2009 | | |
| JP | 2011114206 | | 6/2011 | | |
| JP | 3179086 | | 4/2012 | | |
| JP | 3179086 | U | 10/2012 | | |
| TW | M273031 | | 8/2005 | | |
| TW | M298733 | | 10/2006 | | |
| TW | I266039 | | 11/2006 | | |
| TW | 201305522 | | 2/2013 | | |
| TW | 2013020883 | | 5/2013 | | |
| TW | 201441626 | | 11/2014 | | |
| TW | I531795 | B | 5/2016 | | |
| TW | I540955 | B | 7/2016 | | |
| TW | I606224 | B | 11/2017 | | |
| TW | M587771 | U | 12/2019 | | |
| WO | 0165900 | | 9/2001 | | |
| WO | 03055055 | | 7/2003 | | |
| WO | 2005017468 | | 2/2005 | | |
| WO | 2005096377 | | 10/2005 | | |
| WO | 2006052317 | | 5/2006 | | |
| WO | 2006119761 | | 11/2006 | | |
| WO | 2007029253 | | 3/2007 | | |
| WO | 2010/054786 | A1 | 5/2010 | | |
| WO | 2014141162 | | 9/2014 | | |

OTHER PUBLICATIONS

"WaterChill CPU Cooler Antarctica for Intel Socket 478, AMD Socket 462/754/940," Jun. 4, 2004, 9 pages, Version 4.1, Asetek, Inc.

3Dgameman, "#530—Asetek WaterChill2 Water Cooling Kit," YouTube, Jul. 16, 2006, (https://www.youtube.com/watch?v=60XNAXO9cxY) last accessed on Oct. 30, 2020.

3Dgameman, "#596—Asetek Xtreme WaterChill Water Cooling Kit," YouTube, Jul. 17, 2006, (https://www.youtube.com/watch?v=Z9XSJBCJttU) last accessed on Oct. 29, 2020.

Adrian Willson, "(1080) Koolance CPU 360 CPU Waterblock Review," YouTube, Mar. 14, 2010, (https://www.youtube.com/watch?v=hhWP7rF1uQs) last accessed on Oct. 30, 2020.

Asetek Antarctica Waterblock Overlookers, Feb. 28, 2004 (https://www.overclockers.com/asetek-antarctica-waterblock/) last accessed, Sep. 30, 2021, 6 pages.

Asetek Antarctica WaterChill CPU Cooling Kit Review, Overclocker Club, Apr. 25, 2004 (https://www.overclockersclub.com/reviews/asetek/5.htm) last accessed Jun. 14, 2022.

Asetek Reviews TechPowerUp Review Database (https://www.techpowerup.com/reviewdb/Cooling/Water/Asetek/) last accessed Sep. 30, 2021, 3 pages.

Asetek WaterChill Antarctica Water Cooling Kit, Asetek, (https://www.extremeoverclocking.com/reviews/cooling/WaterChill_Antarctica_1.html) last accessed on Oct. 30, 2020, 11 pages.

Asetek WaterChill Techspot, Mar. 14, 2006 (https://www.techspot.com/community/topics/asetek-waterchill.46119/), last accessed Sep. 30, 2021, 7 pages.

Centrifugal Pump Overview, Appendix B., http://nptel.ac.in/courses/112104117/ui/Course_home-8.htm, Jan. 5, 2018, pp. 1-10.

Cool 'n' Quiet Technology Installation Guide for AMD Athlon 64 Processor Based Systems, Revision 0.04, Advanced Micro Devices, Inc., Jun. 2004.

CPU-360 Water Block (AMO/Intel Processor). Rev 1.1, Koolance, (https://koolance.com/cpu-360-processor-water-block) last accessed on Oct. 30, 2020, 11 page.

Data Center Thermal Zone Mapping, Hewlett-Packard Development Company, LP, Ferrer, et al., 4AA1-5481ENW, Sep. 2007.

Dave Altavilla, "Asetek Antarctica WaterChill Water Cooling Kit.," HotHardware.com, Jun. 8, 2004, (https://hothardware.com/reviews/asetek-antarctica-waterchill-water-cooling-kit) last accessed on Nov. 3, 2020, 7 pages.

Electronic-Actuated Valves, Direct Industry, Available at https://www.directindustry.com/industrial-manufacturer/electrically-actuated-valve-118189.html (last visited Mar. 26, 2022).

Feng Cui, Minglu Zhang, Lingyu Sun, "Design of GPS/MM/GPRS Integrated Location System for the Mobile Robot" IEEE 2006, 6 pages.

Final Office Action in U.S. Appl. No. 15/354,982, mailed Oct. 9, 2018, 9 pages.

Hilbert Hagedoom, "Aseteck Waterchill Watercooling—p. 1—a Chill Introduction," Guru3D.com, Feb. 28, 2005, 25 pages.

Hilbert Hagedoom, "Koolance CPU-360 Waterblock," Guru.com, Feb. 9, 2010, (https://www.guru3d.com/news-story/koolance-cpu-360-waterblock), last accessed on Nov. 3, 2020, 2 pages.

International Preliminary Report on Patentability received for PCT Patent Application No. PCT/IB2023/050552 , mailed on Aug. 8, 2024, 7 pages.

International Search Report and Written Opinion received for PCT Patent Application No. PCT/IB2023/050552, mailed on May 9, 2023, 10 pages.

Invitation to Pay Additional Fee received for PCT Patent Application No. PCT/IB2018/057907, mailed on Nov. 14, 2018, 2 pages.

John S. Scott, "Header" and "Manifold," Dictionary of Civil Engineering, 4th Edition, 1993, pp. 211 and 269, Van Nostrand Reinhold, New York, NY.

Kandlikar, S.G., "High Flux Heat Removal with Microchannels. A Roadmap of Challenges and Opportunities," Heat Transfer Engineering. vol. 26 No. 8 : 5-14, (2005), pp. 5-14.

Matthew Homan, "WaterChill by Asetek," Techwarelabs, LLC, Dec. 11, 2004, (http://www.techwarelabs.com/reviews/cooling/asetek_waterchill/) last accessed on Jun. 14, 2022, 3 pages.

Merriam-webster definition of beveled, dated Jan. 26, 2016, retrieved from internet URL: http://www.merriam-webster.com/dictionary/beveled, pp. 1-4.

Office Action received for Taiwan Patent Application No. 112103044, mailed on Oct. 9, 2024, 8 pages.

Pollard, United States Patent and Trademark Office Patent Owner's Response. Filed Mar. 9, 2016 in Case IPR2015-01276.

Refrigerador de CPUs WaterChill Antarctica Para Intel Socket 478, AMD Socket 462/754/940, Jun. 4, 2004, 9, pages, Version 4.0, Asetek, Inc.

Restriction Requirement for U.S. Appl. No. 14/283,163, mailed Jun. 13, 2014.

Rob Darby, "Internal Flow Applications," Chemical Engineering Fluid Mechanics, 2001, pp. 195-238, Chapter 7, Marcel Dekker, Inc., New York, NY.

Ryszard Sommefeldt, "Review: Asetek WaterChill Antarctica KT03A-L30," HEXUS.net, Aug. 2, 2004, 3 pages (https://m.hexus.net/tech/reviews/cooling/791-asetek-waterchill-antarctica-kt03a-130/?page=2) last accessed Sep. 30, 2021.

Schmidt, R.R., "Liquid Cooling is Back," Electronics Cooling Magazine, Published Aug. 1, 2005, Retrieved from the Internet URL: https://www.electronics-cooling.com/2005/08/liquid-cooling-is-back/, on Apr. 30, 2014, pp. 1-7.

Steinke, M., and Kandlikar, S.G., "Single-Phase Heat Transfer Enhancement Techniques in Microchannel and Minichannels Flows," Microchannels and Minichannels—2004, published on Jun. 17-19, 2004, Rochaster, New York, pp. 1-8.

(56) References Cited

OTHER PUBLICATIONS

Super1080p, "(1080) Koolance CPU 360 CPU Waterblock Review," YouTube, Mar. 17, 2010, (https://www.youtube.com/watch?v=3kg4Yvl1XLU) last accessed on Oct. 30, 2020. (Year: 2010).

TW OA with English Translation for TW 112103044 dated Oct. 17, 2023.

WaterChill CPU Cooler Antarctica for Intel Socket 478, AMO Socket A/754/940, Apr. 13, 2004, 14 pages, Version 4.0, Asetek, Inc. (Year: 2004).

WaterChill CPU-Kiihler Antarctica FLr Intel Socket 478, AMD Socket 462/754/939/940, Jun. 4, 2004, & Oct. 18, 2004, 9 pages, Version 4.0 & 4.1, Asetek, Inc.

WaterChill CPU-Kuhler Antarctica Fur Intel Socket 478, AMO Socket 462/754/940, Jun. 4, 2004, 10 pages, Version 4.0, Asetek, Inc. (Year: 2004).

English Translation of Office Action in Japanese Application No. 2012-002117, mailed May 7, 2012.

English Translation Technical Opinion Jan. 10, 2013 for Japanese Reg. No. 3179086 (Utility Model Appl. No. 2012-002117).

English Translation of Second Technical Opinion for Japanese UTM Application No. 2012-002117, mailed Jul. 19, 2013.

English Translation Search and Exam reports for Taiwanese Application No. 101110072, mailed Apr. 9, 2014, 40 pages.

English Translation of Exam Report in Taiwan Application No. 101110072, mailed Feb. 8, 2017, 6 pages.

English Translation of Notice of Allowance in Taiwan Application No. 101110072, mailed Aug. 17, 2017.

Restriction Requirement for U.S. Appl. No. 12/189,476, mailed Jan. 24, 2012.

Office Action in U.S. Appl. No. 12/189,476, mailed Apr. 13, 2012, 9 pages.

Final OA for U.S. Appl. No. 12/189,476 mailed Jan. 7, 2013, 10 pages.

Notice of Allowance in U.S. Appl. No. 12/189,476, mailed Apr. 28, 2014.

Restriction Requirement for U.S. Appl. No. 13/401,618, mailed Sep. 18, 2014, 8 pages.

Preissuance Submission dated Jan. 9, 2015, U.S. Appl. No. 13/401,618.

Non-Final Office Action in U.S. Appl. No. 13/401,618, mailed Jul. 28, 2015, 20 pages.

Final Office Action in U.S. Appl. No. 13/401,618, mailed Jan. 26, 2016, 23 pages.

Notice of Allowance for U.S. Appl. No. 13/401,618, mailed Jul. 27, 2016, 10 pages.

Non-Final Office Action in U.S. Appl. No. 15/263,210, mailed Feb. 10, 2017, 5 pages.

Notice of Allowance in U.S. Appl. No. 15/263,210, mailed Oct. 30, 2017, 14 pages.

Restriction Requirement for U.S. Appl. No. 14/283,163, mailed Jun. 13, 2014, 6 pages.

Non-Final Office Action in U.S. Appl. No. 14/283,163, mailed Sep. 30, 2014, 10 pages.

Final Office Action in U.S. Appl. No. 14/283,163, mailed May 14, 2015, 15 pages.

Advisory Action for U.S. Appl. No. 14/283,163, mailed Aug. 30, 2015, 3 pages.

Non-Final Office Action in U.S. Appl. No. 14/283,163, mailed Sep. 4, 2015, 15 pages.

Final Office Action in U.S. Appl. No. 14/283,163, mailed Jun. 15, 2016, 12 pages.

Notice of Allowance in U.S. Appl. No. 14/283,163, mailed Jan. 19, 2017, 17 pages.

Non-Final Office Action in U.S. Appl. No. 15/462,753, mailed May 11, 2017, 11 pages.

Final Office Action in U.S. Appl. No. 15/462,753, mailed Sep. 15, 2017, 14 pages.

Restriction Requirement for U.S. Appl. No. 13/559,340, mailed Oct. 31, 2014, 10 pages.

Third Party Submission under 37 CFR 1.290 in U.S. Appl. No. 13/559,340, dated Jan. 9, 2015, 9 pages.

Non-Final Office Action in U.S. Appl. No. 13/559,340, mailed Mar. 26, 2015, 12 pages.

Final Office Action in U.S. Appl. No. 13/559,340, mailed Sep. 8, 2015, 13 pages.

Advisory Action for U.S. Appl. No. 13/559,340, mailed Dec. 2, 2015, 4 pages.

Non-Final Office Action in U.S. Appl. No. 13/559,340, mailed Jan. 15, 2016, 22 pages.

Notice of Allowance for U.S. Appl. No. 13/559,340, mailed Sep. 23, 2016, 10 pages.

Non-Final Office Action in U.S. Appl. No. 15/351,362, mailed Feb. 7, 2019, 20 pages.

Non-Final Office Action in U.S. Appl. No. 11/745,932, mailed Jan. 25, 2010, 16 pages.

Final Office Action in U.S. Appl. No. 11/745,932, mailed Aug. 30, 2010, 12 pages.

Non-Final Office Action in U.S. Appl. No. 11/745,932, mailed Mar. 28, 2011, 11 pages.

Final Office Action in U.S. Appl. No. 11/745,932, mailed Feb. 3, 2012, 12 pages.

Non-Final Office Action in U.S. Appl. No. 13/776,673, mailed Jul. 11, 2013, 19 pages.

Restriction Requirement for U.S. Appl. No. 14/210,165, mailed Jun. 12, 2014, 5 pages.

Non-Final Office Action for U.S. Appl. No. 14/210,165, filed Sep. 29, 2014, 16 pages.

Ex Parte Quayle Action for U.S. Appl. No. 14/210,165, mailed Feb. 5, 2015, 5 pages.

Notice of Allowance in U.S. Appl. No. 14/210,165, mailed Feb. 20, 2015, 7 pages.

Restriction Requirement for U.S. Appl. No. 14/217,080, mailed Sep. 21, 2016, 5 pages.

Non-Final Office Action in U.S. Appl. No. 14/217,080, mailed Mar. 9, 2017, 11 pages.

Notice of Allowance in U.S. Appl. No. 14/217,080, mailed Nov. 1, 2017, 8 pages.

International Search Report and Written Opinion in PCT Application No. PCT/IB2014/059768, mailed Jul. 9, 2014, 17 pages.

International Preliminary Report on Patenability in PCT Application No. PCT/IB2014/059768, mailed Sep. 15, 2015 9 pages.

Non-Final Office Action in U.S. Appl. No. 14/777,510, mailed Oct. 11, 2017.

Non-Final Office Action in U.S. Appl. No. 14/777,510, mailed Apr. 23, 2018, 23 pages.

Office Action in U.S. Appl. No. 15/351,362, mailed Feb. 7, 2019, 20 pages.

International Preliminary Report on Palatability for PCT Application No. PCT/IB2018/057907, mailed Apr. 23, 2020, 6 pages.

Final Office Action in U.S. Appl. No. 14/777,510, mailed Jul. 30, 2018, 23 pages.

Non-Final Office Action in U.S. Appl. No. 12/368,205, mailed Sep. 11, 2011, 8 pages.

Restriction Requirement for U.S. Appl. No. 14/550,952, mailed Feb. 5, 2015, 6 pages.

Non-Final Office Action for U.S. Appl. No. 14/550,952, mailed Jul. 7, 2015, 13 pages.

Final Office Action in U.S. Appl. No. 14/550,952, mailed Oct. 20, 2015, 15 pages.

Non-Final Office Action in U.S. Appl. No. 15/354,982 mailed May 8, 2018, 19 pages.

Restriction Requirement for U.S. Appl. No. 14/183,443, mailed May 22, 2014.

Non-Final Office Action in U.S. Appl. No. 14/183,443, mailed Oct. 30, 2014.

Notice of Allowance in U.S. Appl. No. 14/183,443, mailed Apr. 30, 2015.

International Search Report and Written Opinion in PCT Application No. PCT/IB2018/057907, mailed Jan. 23, 2019, 9 pages.

Osinski, USPTO Decision of Institution of Inter Parties Review, filed Dec. 9, 2015 in Case IPR2015-01276.

Pollard, USPTO Owner's Response, filed Mar. 9, 2016 in Case IPR2015-01276.

(56)           References Cited

OTHER PUBLICATIONS

Petition for Inter Parties Review of U.S. Pat. No. 8,746,330 in *Asetek Danmark A/S* v. *CoolIT Systems Inc.*, filed May 27, 2015.
Declaration of Dr. Donald Tilton (including his CV) from Petition for Inter Parties Review of U.S. Pat. No. 8,746,330 in *Asetek Danmark A/S* v. *CoolIT Systems Inc.*, dated May 27, 2015.
Petition for Inter Partes Review of U.S. Pat. No. 8,749,968; United States Patent and Trademark Office, Before the Patent Trial and Appeal Board, *CoolIT Systems, Inc.* v. *Asetek A/S*, Inter Parties Review No. 2014-01172, Jul. 16, 2014, 61 pages.
USPTO Patent Trial and Appeal Board Final Written Decision in Case IPR2015-01276, mailed Dec. 8, 2016.
Non-Final Office Action in U.S. Appl. No. 11/745,932, mailed Jul. 2, 2012, 14 pages.
Exam Report for European Application No. 07075014.6, mailed Mar. 11, 2011, 9 pages.
English Translation of Notice of Allowance in Taiwan Application No. 101127180, mailed Feb. 19, 2016, 3 pages.
English Translation of Examination and Search Report for Taiwan Application No. 103109612, mailed Jan. 1, 2015, 9 pages.
English Translation of Examination and Search Report for Taiwan Application No. 101127180, mailed May 21, 2015, 7 pages.
English Translation of Notice of Allowance in Taiwan Application No. 103109612, mailed Dec. 11, 2015, 3 pages.
Office Action for Taiwan Application No. 103109612, mailed Sep. 21, 2015, 2 pages.
Knight, et al., "Heat Sink Optimization with Application to Microchannels," IEEE Transactions on Components, Hybrids, and Manufacturing Technology, vol. 15, No. 5, Oct. 1992, pp. 832-842.
Vertal, L. "Water Cooling Comes of Age Again," Asetek Data Center Liquid Cooling, Published on Oct. 11, 2013, Retrieved from the Internet URL: http://www.asetek.com/press-room/blog/2013/water-cooling-come-of-age-again/, on Jan. 4, 2018, pp. 1-10.
Gabriel Torres, CoolIT Water-Cooling Products, http://hardwaresecrets.com/printpage/CoolIT-Water-Cooling-Product/515, Jan. 14, 2008, 9 pages.
Michael J. Ellsworth, Jr P.E., "Thermal Design and Implementation of Robust Liquid Cooling Systems for High Performance Computer Systems," Systems and Technology Group, IBM, InterPACK '11, Jul. 6-8, 2011.
Roger R. Schmidt, "Liquid Cooling is Back," Aug. 1, 2005, 7 pages.
Ellsworth, Jr, et al., "The Evolution of Water Cooling for IBM Larger Server Systems: Back to the Future," IEEE, 2008, 9 pages.
H.F. Hamann, et al., "Uncovering Energy-Efficiency Opportunities in Data Centers," IBM 2009, pp. 10:1-10:12.
Extended Supplementary European Search Report received for EP Patent Application No. 23743063.2, mailed on Jul. 15, 2025, 13 pages.

* cited by examiner

1700

COOLING SYSTEMS, CONTROLLERS AND METHODS

CROSS-REFERENCE TO RELATED APPLICATIONS

This application is a continuing patent application claiming priority from and benefit of co-pending U.S. patent application Ser. No. 16/158,227, filed on Oct. 11, 2018, which claims priority from and benefit of provisional U.S. Patent Application No. 62/571,420 filed on Oct. 12, 2017, each of which patent applications is hereby incorporated by reference in its entirety as if fully set forth herein, for all purposes.

BACKGROUND

This application pertains to concepts disclosed in co-pending U.S. patent application Ser. No. 15/354,982, which claims benefit of and priority from U.S. Patent Application No. 62/256,519, filed Nov. 17, 2015, and benefit of and priority from U.S. patent application Ser. No. 14/777,510, filed Sep. 15, 2015, which is a U.S. National Phase application of International Patent Application No. PCT/IB2014/059768, filed Mar. 14, 2014, which claims benefit of and priority to U.S. Patent Application No. 61/793,479, filed Mar. 15, 2013, U.S. Patent Application No. 61/805,418, filed Mar. 26, 2013, U.S. Patent Application No. 61/856,566, filed Jul. 19, 2013, and U.S. Patent Application No. 61/880,081, filed Sep. 19, 2013, each of which patent applications is hereby incorporated by reference in its entirety as if fully set forth herein, for all purposes.

Other pertinent disclosures include U.S. Patent Application No. 61/522,247, filed Aug. 11, 2011, U.S. Patent Application No. 61/622,982, filed Apr. 11, 2012, U.S. Patent Application No. 61/794,698, filed Mar. 15, 2013, U.S. patent application Ser. No. 13/559,340, filed Jul. 26, 2012, now U.S. Pat. No. 9,496,200, U.S. Patent Application No. 61/908,043, filed Nov. 23, 2013, and U.S. patent application Ser. No. 14/550,952, filed Nov. 22, 2014, each of which patent applications is hereby incorporated by reference in its entirety as if fully set forth herein, for all purposes.

The innovations and related subject matter disclosed herein (collectively referred to as the "disclosure") pertain to control of fluid-flows in heat-transfer systems, and more particularly, but not exclusively, to systems, controllers and methods for governing flows and controlling pumps, e.g., in correspondence with one or more observed differential-pressures within a heat-transfer system.

For example, a typical server rack of the type used in a data center can accommodate 42 individual servers, each server corresponding to a cooling node within a heat-transfer system. Naturally, some server racks can accommodate more or fewer individual servers. As well, some server racks might not be fully populated. Some coolant-distributers use one or more rack-level (e.g., "centralized") pumps to distribute coolant among a plurality of connected cooling nodes, and it would be desirable for a given coolant-distributer embodiment to be suitable for use across a variety of server-rack configurations, such as for use with a fully-populated 42 U rack housing 42 individual servers, as well as a lightly populated 10 U rack housing, e.g., 5 individual servers, and a custom 60 U rack housing 60 (or more) individual servers.

Conventionally, coolant-distributers have been designed to operate under a maximum expected load, e.g., without being adjustable to operate at lesser loads. For example, a conventional coolant-distributer for a typical 42 U rack typically has one or more pumps arranged and selected to distribute coolant among 42 individual cooling nodes (e.g., one node for each of 42 individual servers housed in the 42 U rack). In that example, the pumps can be selected to operate efficiently and to deliver an optimal pressure-head and optimal flow-rates to the various nodes throughout the cooling system when such a conventional coolant-distributer is used in conjunction with a fully-populated server rack. Nonetheless, such pumps may operate less efficiently and/or may deliver less-than-optimal (e.g., a too-high or a too-low) pressure-heads and (e.g., a too-high or a too-low) flow-rates when more or fewer cooling nodes are connected to the coolant-distributer as compared to a number of cooling nodes assumed to be connected when choosing an "optimal" design configuration.

For example, a conventional coolant-distributer may be designed to deliver coolant to 42 cooling nodes at a pressure of about 12 psi. If, say, 35 cooling nodes are disconnected from the conventional coolant distributer, the pumps may deliver coolant at a substantially higher pressure head and may not operate as efficiently and/or may consume higher power as compared to when 42 cooling nodes are connected.

SUMMARY

Innovations and related subject matter disclosed herein overcome many problems in the prior art and address one or more of the aforementioned, or other, needs. This disclosure pertains generally to control of fluid-flows in heat-transfer systems, for example, systems, controllers and methods for governing flows and controlling pumps in correspondence with one or more observed differential-pressures within a heat-transfer system. Such systems, controllers and methods can provide desired flow rates among each in a plurality of connected cooling nodes, despite that the number in the plurality can vary between about 1 node and about 60 nodes, for example. Nonetheless, disclosed concepts can be applied to a larger range of cooling nodes and/or larger or smaller numbers of cooling nodes.

Embodiments of cooling systems, controllers and methods can provide desired flow-rates and pressure-heads under a variety of cooling-system configurations. For example, certain embodiments of cooling systems, controllers and methods provide coolant to each in a selected plurality of cooling nodes (each corresponding to an individual server) within a selected range of flow rates and a selected range of pressures, despite that the selected plurality of cooling nodes can range in number, for example, between about 1 node and about 60 nodes, such as between about 5 nodes and about 50 nodes, with between about 8 nodes and about 42 nodes being but one particular range of nodes.

According to one aspect, a system includes an enclosure having an inlet to the enclosure and a wall at least partially defining a boundary of the enclosure. The enclosure is configured to receive a liquid from the inlet and to contain the received liquid. An aperture is in the wall. A conduit is coupled with the aperture, wherein the conduit comprises a segment extending into the enclosure from the aperture. A baffle defines a corresponding plurality of apertures and is positioned between the inlet and the segment of the conduit. The baffle is oriented such that liquid received from the inlet passes through the plurality of apertures in the baffle before entering the segment of conduit.

The segment of conduit extending into the enclosure can define an arcuate segment such that an end of the segment of conduit is positioned lower, relative to gravity, than a centroid of the aperture in the wall. The segment of the conduit extending into the enclosure can define an end positioned distally from the aperture in the wall. The end can define a second aperture and the second aperture can be oriented transversely relative to the aperture in the wall.

The segment of the conduit extending into the enclosure can define an end positioned distally from the aperture in the wall. The end can define a second aperture and the second aperture can be oriented transversely relative to the baffle.

The baffle can be a first baffle and the corresponding plurality of apertures can be a first plurality of apertures. The system can also have a second baffle defining a second plurality of apertures.

Each of the first plurality of apertures and the second plurality of apertures can have a corresponding hydraulic diameter. Each hydraulic diameter can be characteristic of the respective plurality of apertures. The hydraulic diameter characteristic of the first plurality of apertures can differ from the hydraulic diameter characteristic of the second plurality of apertures. A hydraulic diameter characteristic of the first plurality of apertures can be substantially equal of a hydraulic diameter characteristic of the second plurality of apertures.

The baffles can be arranged in order of decreasing hydraulic diameter along a direction extending from the inlet to the conduit segment.

The plurality of apertures of the first baffle can be offset from the plurality of apertures of the second baffle.

According to an aspect, a system can include a reservoir defining an inlet and an outlet. The reservoir can be configured to hold a liquid received from the inlet. The system can include a pump and a fluid conditioning unit. The pump can be fluidically coupled to the reservoir and configured to pump the liquid from the reservoir to the fluid conditioning unit. A sensor can be configured to observe an operational parameter associated with the fluid conditioning unit. The system can include control logic. The control logic can be configured to communicate a control signal to the pump, receive a signal from the sensor; and iteratively activate and deactivate the pump via the control signal until the signal received from the sensor comprises an indication that the fluid conditioning unit is filled with a liquid to a specified amount.

Such a system can also include a fill tank fluidically coupled to the reservoir. The system can include a second pump configured to pump liquid from the fill tank to the reservoir. The control logic can be configured to communicate a second control signal to the second pump to activate and deactivate the second pump.

The sensor can be a temperature sensor, a pressure sensor, a liquid detection sensor, a flow sensor, or a fluid level sensor, for example.

The system can include plurality of pumps fluidically coupled to the reservoir. Each of the plurality of pumps can be configured to pump the liquid from the reservoir to a closed-loop liquid system.

The control logic can be configured to iteratively activate and deactivate each of the plurality of pumps.

The control logic can be configured to iteratively activate and deactivate each of the plurality of pumps sequentially. The control logic can be configured to iteratively activate and deactivate each of the plurality of pumps concurrently or jointly.

According to an aspect, control systems are described. A control system can be for a heat-transfer system. Such a control system can include a plurality of sensors. Each sensor can be configured to observe an operational parameter indicative of a thermodynamic quantity and to emit a signal containing information corresponding to the observed operational parameter. Control logic can include a processing unit and instructions stored on a memory that, when executed by the processing unit, cause the control logic to determine a first thermodynamic quantity associated with each sensor from information contained in a signal from the respective sensor. The instructions, when executed by the processor, can further cause the control logic to determine a second thermodynamic quantity associated with each sensor from information contained in a signal received from at least one other sensor in the plurality of sensors. The instructions, when executed by the processor, can further cause the control logic to compare the first thermodynamic quantity with the second thermodynamic quantity; and responsive to the comparison of the first thermodynamic quantity with the second thermodynamic quantity, output a control signal.

The instructions that cause the control logic to output a control signal responsive to the comparison of the first thermodynamic quantity with the second thermodynamic quantity can include instructions to output the control signal responsive to a difference between the first thermodynamic quantity and the second thermodynamic quantity exceeding a threshold difference, or instructions to output the control signal responsive to a difference between the first thermodynamic quantity and the second thermodynamic quantity falling below a threshold difference.

The plurality of sensors can include a temperature sensor. The instructions that cause the control logic to determine a second thermodynamic quantity can include instructions that cause the control logic to predict a temperature corresponding to the temperature sensor from information contained in a signal received from at least one other sensor in the plurality of sensors.

The plurality of sensors can include a pressure sensor. The instructions that cause the control logic to determine a second thermodynamic quantity can include instructions that cause the control logic to predict a pressure corresponding to the pressure sensor from information contained in a signal received from at least one other sensor in the plurality of sensors.

Other innovative aspects of this disclosure will become readily apparent to those having ordinary skill in the art from a careful review of the following detailed description (and accompanying drawings), wherein various embodiments of disclosed innovations are shown and described by way of illustration. As will be realized, other and different embodiments of systems, controllers and methods incorporating one or more of the disclosed innovations are possible and several disclosed details are capable of being modified in various respects, each without departing from the spirit and scope of the principles disclosed herein. For example, the detailed description set forth below in connection with the appended drawings is intended to describe various embodiments of the disclosed innovations and is not intended to represent the only contemplated embodiments of the innovations disclosed herein. Instead, the detailed description includes specific details for the purpose of providing a comprehensive understanding of the principles disclosed herein. Accordingly the drawings and detailed description are to be regarded as illustrative in nature and not as restrictive.

BRIEF DESCRIPTION OF THE DRAWINGS

Unless specified otherwise, the accompanying drawings illustrate aspects of the innovative subject matter described herein. Referring to the drawings, wherein like reference numerals indicate similar parts throughout the several views, several examples of systems incorporating aspects of the presently disclosed principles are illustrated by way of example, and not by way of limitation.

DETAILED DESCRIPTION

The following describes various principles related to systems, controllers and methods by way of reference to specific examples of systems, controllers and methods, including specific arrangements of pumps, heat exchangers, conduits, sensors, and actuators, as well as specific examples of data structures, data types, computations, state variables, equations-of-state, performance targets, performance characteristics, performance variables and system, data, and computational architectures embodying innovative concepts. More particularly, but not exclusively, such innovative principles are described in relation to selected examples of systems, controllers and methods for purposes of succinctness and clarity. Nonetheless, one or more of the disclosed principles can be incorporated in various other embodiments of systems, controllers and methods to achieve any of a variety of desired outcomes, characteristics, and/or performance criteria. Systems, controllers and methods described in relation to particular configurations, applications, uses, or acts are merely examples of systems, controllers and methods incorporating one or more of the innovative principles disclosed herein and are used to illustrate one or more innovative aspects of the disclosed principles.

Thus, systems, controllers and methods having attributes that are different from those specific examples discussed herein can embody one or more of the innovative principles, and can be used in applications not described herein in detail, for example, to detect a failed sensor, to confirm a measure of health of a sensor, and/or to detect a leak of a fluid (e.g., a liquid, a gas, or a saturated mixture thereof) from, or to observe a local speed of a flow of such a fluid through, a heat-transfer system having any of a variety of flow configurations, such as a contained flow within a fluid conduit or a free-stream flow (e.g., a region of a fluid flow sufficiently spaced from a fluid boundary as not to be influenced by the boundary). Accordingly, embodiments of systems, controllers and methods not described herein in detail also fall within the scope of this disclosure, as will be appreciated by those of ordinary skill in the art following a review of this disclosure.

Overview

Figures 1A, 1B:
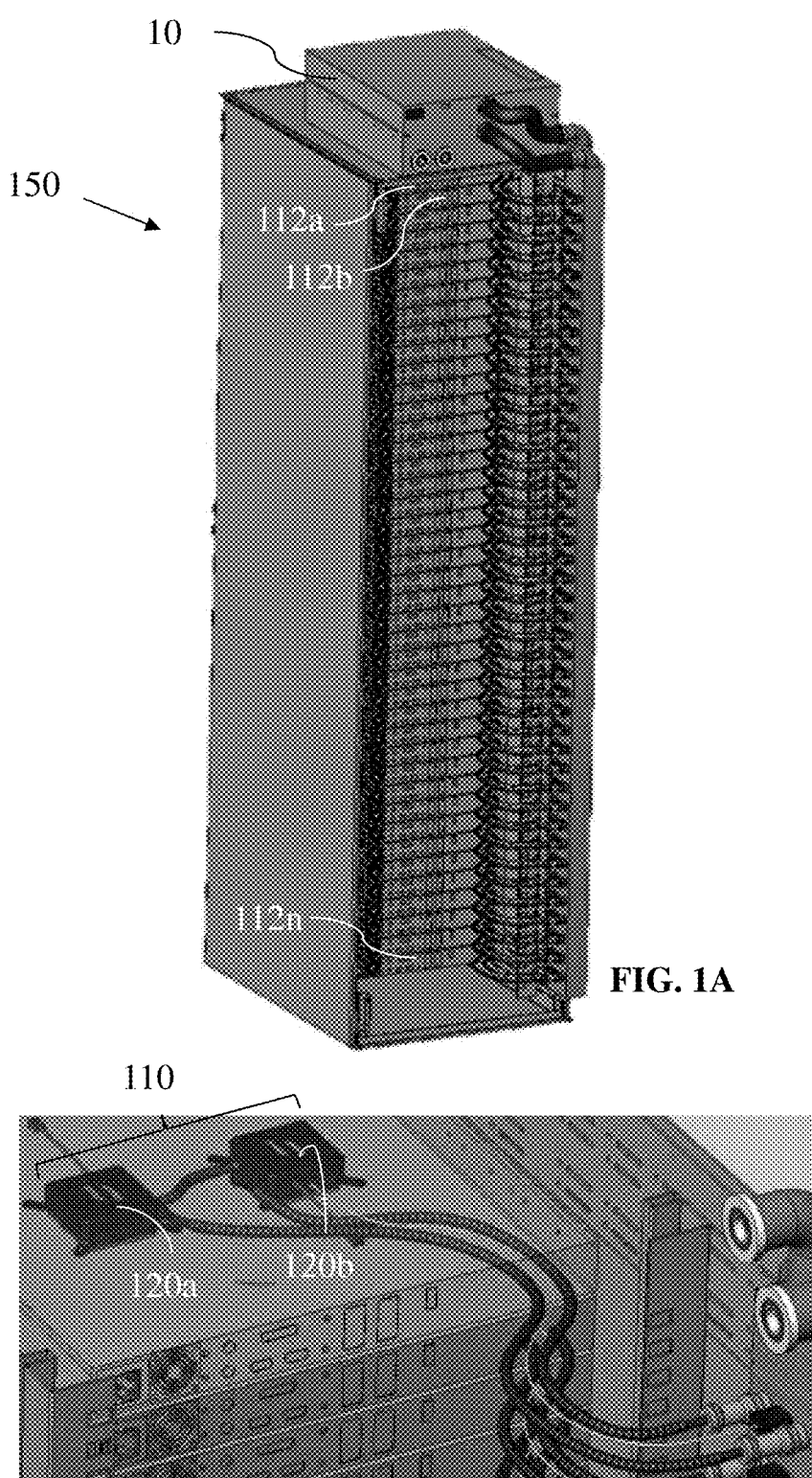
FIG. 1A illustrates a modular heat-transfer system configured to cool a plurality of independently operable, rack-mounted servers.
FIG. 1B shows an isometric view of a portion of the modular heat-transfer system shown in FIG. 1, together with features of a heat-transfer element.

FIG. 1A shows an array 150 of independently operable servers 112a, 112b . . . 112n mounted in a rack, or chassis, together with aspects of a heat-transfer system for cooling the servers. In FIG. 1A, each server 112 has one or more corresponding heat sources.

A heat-transfer system can collect heat from each heat source and carry the heat to a suitable heat sink, e.g., a facility liquid and/or air in a conditioned room containing the rack of servers. Thus, such a heat-transfer system can include several different components arranged to dissipate heat from any of a variety of heat sources to one or more heat sinks.

For example, in FIG. 1A, a fluid-conditioning unit (also sometimes referred to as a coolant heat-exchange unit) 10 is shown. The fluid conditioning unit 10 can receive a warm coolant carrying heat from the servers 112a-n and facilitate transfer of that heat to another medium. The fluid conditioning unit 10 can return the coolant to the servers to collect further heat from the servers.

FIG. 1B illustrates aspects of a representative heat-transfer element 110 within the heat-transfer system shown in FIG. 1A. The heat-transfer element 110 corresponds to one of the servers 112a-n. The heat-transfer element 110 can be thermally coupled to a corresponding one or more components that dissipate(s) heat during operation of the respective server. In FIG. 1B, the heat-transfer element 110 has two constituent component heat-exchange modules 120a, 120b, each of which can be thermally coupled with a corresponding heat-dissipation element (e.g., a processing unit) within the server 112. As coolant passes through each respective heat-transfer module 120a, 120b, the coolant can absorb heat dissipated by the heat-dissipation element. The warmed coolant can then be carried to the fluid-conditioning unit 10, where the heat is transferred to another medium (e.g., facility water). Such an arrangement for cooling rack mounted servers is described in further detail in U.S. Pat. No. 9,496,200. Representative heat-exchange modules are described in further detail in U.S. Pat. Nos. 8,746,330 and 9,453,691. The heat-exchange modules can be passive, as in the '330 Patent, or they can be active, e.g., include a pump, as in the '691 Patent.

Figure 1C:
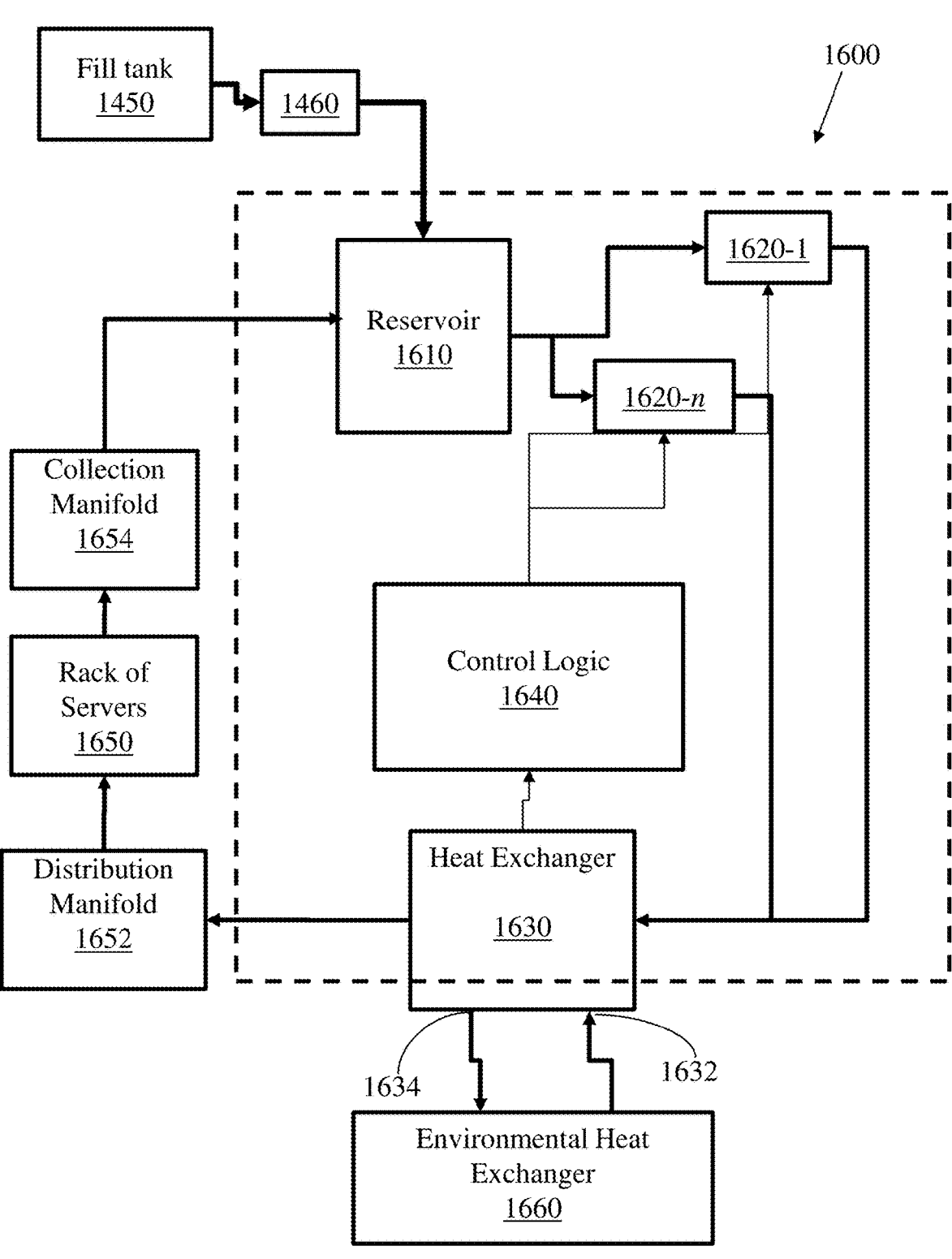
FIG. 1C shows a block diagram of a liquid-cooled heat exchange system configured to cool servers in a rack-mountable server system.

FIG. 1C schematically illustrates a cooling system suitable for cooling an array of rack mounted servers 1650, similar to the rack of servers 150 in FIGS. 1A and 1B. In FIG. 1C, the fluid conditioning unit 1600 is arranged similarly to the fluid conditioning unit 10 in FIG. 1A. The conditioning unit 1600 includes a reservoir 1610 and a plurality of distribution pumps 1620-1 to 1620-*n*. Coolant collected from the rack of servers 1650 (e.g., by a collection manifold 1654) can flow into the reservoir 1610 and can be pumped by the distribution pump(s) 1620-1 to 1620-*n* to an environmental coupler (e.g., a heat exchanger 1630). In the environmental coupler, heat carried by the coolant can be transferred to another medium (e.g., facility water), cooling the coolant flowing through the environmental coupler. The cooled coolant can then pass back to the rack of servers 1650 (e.g., distributed among the plurality of servers in the rack by the distribution manifold 1652).

In FIG. 1C, the fluid conditioning unit 1600 includes control logic 1640. The control logic can receive information from one or more sensors operatively coupled with any of the components, devices, structures, mechanisms, racks, servers, heat-transfer systems, processing units, computing environments, actuators, etc., described herein. The control logic can process the received information and, responsive to an output of such processing, can emit one or more signals, commands, etc. A component, device, structure, mechanism, rack, server, heat-transfer system, processing unit, computing environment, actuator, etc., described herein can receive an emitted signal or command. Such component, device, structure, mechanism, rack, server, heat-transfer system, processing unit, computing environment, actuator, etc., described herein can respond to a received signal or command emitted by the control logic. Control logic can be implemented in a general purpose computing environment, in an application specific integrated circuit, or in a combination of hardware and software (e.g., firmware).

As an example, a coolant distributer (sometimes also referred to as a fluid conditioning unit) can have a variety of temperature, flow-rate, and/or pressure sensors arranged to observe temperature, flow-rate and pressure (e.g., static and/or stagnation) at one or more selected locations within a fluid circuit (open or closed). A controller can adjust operation of one or more coolant (e.g., a pump, a valve) and/or heat-transfer components (e.g., a logic or other component of a computing environment) to achieve desired flow and/or cooling characteristics.

As but one example, if a static pressure difference across an inlet to and an outlet from a selected fluid circuit (or branch thereof) exceeds a selected upper threshold pressure, one or more pumps can be throttled, as by slowing an impeller speed, thereby reducing the static pressure difference across the inlet and the outlet. Alternatively, if the static pressure difference across the inlet and the outlet falls below a selected lower threshold pressure difference, the one or more pumps can be operated at a higher impeller speed and/or one or more additional pumps can be "brought online" to supplement or augment available pressure head and flow delivery.

As another example, measurement of observable state-variables (e.g., temperature, static pressure, mass, density) combined with known measures of selected properties (e.g., specific heat, heat capacity, compressibility, gas constant, equation-of-state) of a given fluid and/or observable system performance characteristics (e.g., power dissipation from a heat source), health and robustness of system sensors can be assessed, as by control logic, and communicated to a system user or manager. For example, some disclosed systems, controllers and methods can compute values of state variables at one or more selected locations within a selected fluid circuit (or branch thereof) and compare the computed value to an observed value detected from a given sensor.

If an absolute value of a difference between the computed value and the observed value exceeds a selected threshold difference, an innovative control logic, system, controller, or method implemented in control logic, can determine a fault has occurred and can take a remedial action, as by setting a flag, sending an e-mail, and/or initiating an alarm to alert a user of the determined fault. Such a fault can indicate a failed or failing sensor, a leak, an over temperature condition, a failed pump, an under-speed pump, an over-speed pump, a failed or failing controller (e.g., a pump controller).

Disclosed systems, controllers, control logic and methods also provide for automatic control of external fill systems. For example, a disclosed coolant distributer can have a relay or other control output to cause an external pump (e.g., a pump associated with an external fill kit) to actuate in correspondence with a pump associated with the coolant distributer. The relay or other control output can be actuated responsive to an observed and/or computed state of a coolant circuit (or branch thereof). For example, a bleed-valve can be opened to permit a compressible gas to escape from a conduit as the conduit fills with a coolant fluid (e.g., a substantially incompressible liquid). A fluid sensor or a leak detector can determine the conduit is full, as when a selected measure of the fluid is detected within or without the conduit. Responsive to such detection, the relay or other control output can cause the external pump to slow or cease operation, to speed up or increase operation, can open or close a selected valve, and/or cause an internal pump to slow, cease operation, speed up, or increase operation to achieve a desired outcome.

In yet another example, a pressure-relief or check-valve can open to permit a fluid to by-pass a selected fluid circuit or branch thereof responsive to a selected measure of a fluid's state exceeding or falling below a selected threshold. For example, the valve can open to allow a fluid to by-pass a closed fluid conduit, as to prevent a pump from "dead heading" (e.g., operating without a flow of fluid through the pump), as such "dead heading" can cause a pump to over-heat and, eventually, to fail or otherwise be damaged.

Reservoir with Reduced Liquid Entrainment and Cavitation

In closed-loop liquid systems, such as, for example, a liquid-based heat transfer system or other hydraulic system, liquid may be pumped from a reservoir, circulated to one or more other system components, and returned to the reservoir. The reservoir may be positioned in some selected region of the system. The reservoir may have some amount of air or other gas in it in order to accommodate changes in the liquid's volume in the tank, e.g., due to thermal expansions and contractions, despite that many liquids generally are considered and modeled to be incompressible. And, under sufficient pressures or temperatures, the liquid may change state (e.g., vaporize as through cavitation or separation from a surface) to form a saturated mixture (at least locally), reducing the mass of liquid while increasing a mass of gas in the closed system. It may, however, be undesirable to introduce a gas phase into other regions of the closed-loop system. For example, gas bubbles may damage pumps, or cause other harmful effects such as, but not limited to, overheating (e.g., as by blocking a flow of liquid through a passage in a heat exchanger).

Figure 2:
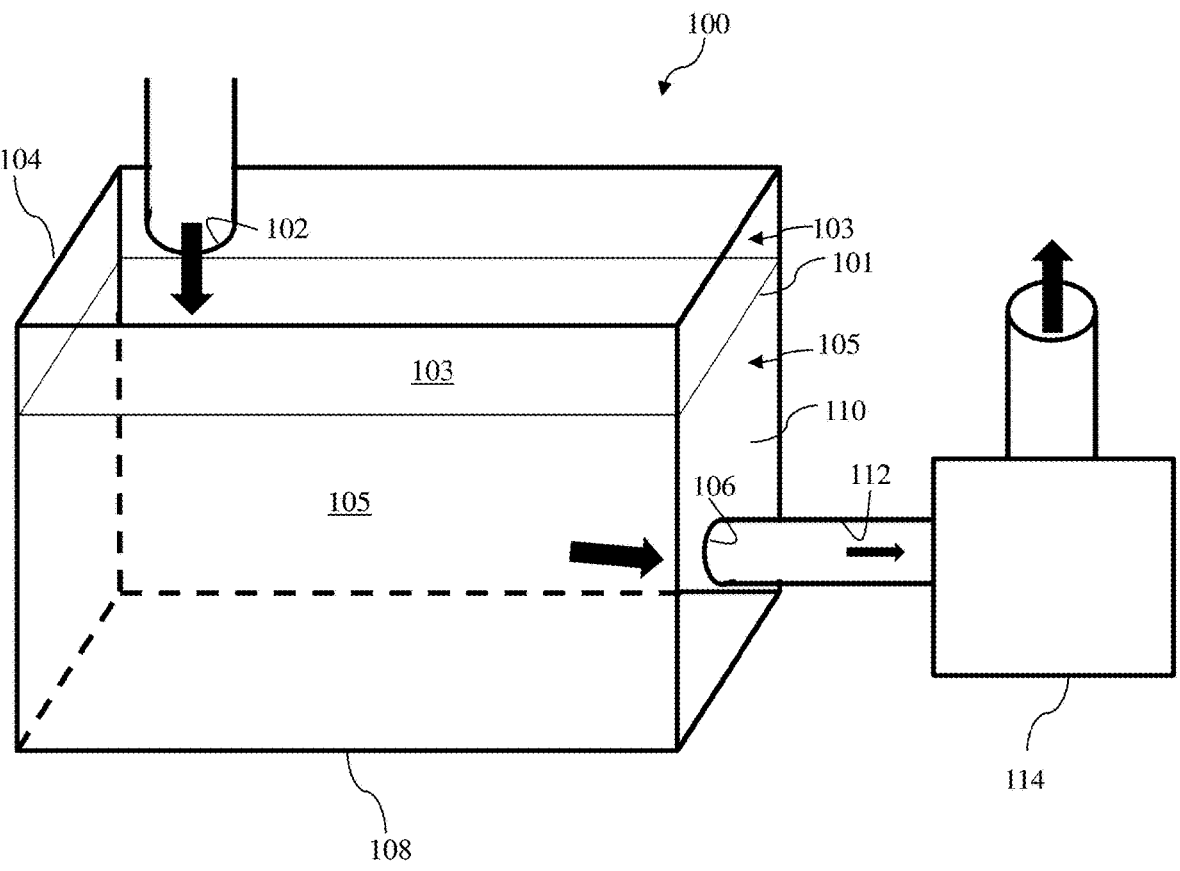
FIG. 2 shows an isometric view of a reservoir tank and a pump.

FIG. 2 shows an isometric view of a reservoir enclosure (sometimes also referred to herein as a "tank"). The illustrated reservoir tank is a sealed tank 100 where the liquid enters from an inlet 102 positioned at or near a top wall 104 of the reservoir.

An outlet aperture 106, located adjacent a floor or other bottom wall 108 of the tank, e.g., on a side wall 110, connects to a liquid conduit 112 that may also connect to a pump 114. The line 101 indicates a level of a free surface of the liquid 105 in the tank. Gas is present in the volume 103 above the line 101. The gas may be air, or a relatively inert gas such as, for example, nitrogen, or a mixture of saturated vapor-phase of the liquid and air (or, e.g., nitrogen). When the liquid 105 exits the tank through the outlet 106, either due to a pump or due to gravity, the flow of the liquid through the outlet may begin to rotate, causing a vortex in a region of the fluid positioned adjacent the outlet, similar to a vortex that forms in a draining bathtub or sink. The vortex may entrain gas in the tank into the liquid and/or may cause cavitation to occur in the swirling flow. Under such conditions, gas may be entrained into the flow through the outlet 106 and introduce the gas into other regions of the closed loop system. As noted, entrained gas bubbles can deteriorate performance and even cause system damage.

Another potential source of damage to closed-loop liquid systems may include cavitation. Cavitation refers to the formation and collapse of vapor bubbles in a liquid, which can occur when a local static pressure in the liquid drops below the vapor pressure of the liquid. Cavitation can occur, for example, when a liquid passes through a flow constriction, as from a relatively large flow cross-section (e.g., within the enclosure 100) through a smaller cross-sectional area (e.g., through the aperture 106). For example, as a liquid-phase fluid passes from a tank to a tube, particularly by passing through a sharp-edged orifice, streamlines of the flow may constrict to a smaller diameter than a diameter (e.g., a hydraulic diameter) of the orifice, causing the flow to separate from the walls of the tube. In such a flow, a speed of the flow increases as the flow constricts, causing regions of lower pressure, e.g., usually at the edges of the transition area, where the liquid flow can separate from a boundary wall and locally cavitate. Once a cavitation (vapor) bubble moves back into a region of higher pressure, it collapses. The collapsing bubble releases a large amount of energy in a concentrated region and can erode surfaces of nearby structure (e.g., walls). Additionally, the vapor bubbles are substantially less dense than the liquid phase and therefore carry less mass, effectively reducing a flow rate of liquid through the cavitation region.

In some cases, a swirling flow may cavitate. For example, in a swirling flow such as a whirlpool, a local pressure within a vortex may drop to a pressure at or below the vapor pressure of the liquid, inducing cavitation in those low-pressure regions.

Accordingly, various aspects of a reservoir of a closed-loop liquid system are described to inhibit or to altogether avoid entraining gas into the liquid conduits, and to inhibit or altogether prevent cavitation and its accompanying effects. In an embodiment, the shape and positioning of the outlet from the reservoir enclosure may reduce a likelihood of either or both entrainment and the effects of cavitation. For example, a "snorkel" may be added to draw fluid into a conduit from an interior region of the tank, as opposed to drawing fluid into the conduit from a sidewall as shown in FIG. 2. Such snorkels are described more fully below.

Additionally, or alternatively, baffles may be added into the reservoir to prevent or inhibit gas entrainment or cavitation, as by inhibiting large-scale swirling flows from forming, disrupting formation of large vortices, straightening flows, etc. Such baffles are described more fully below.

The illustrated tank has a generally hollow, prismatic structure, e.g., as a hollow rectangular prism. Of course, hollow enclosures of other shapes are possible and can incorporate aspects described in relation to FIG. 2 and other embodiments of tanks described herein.

Figure 3:
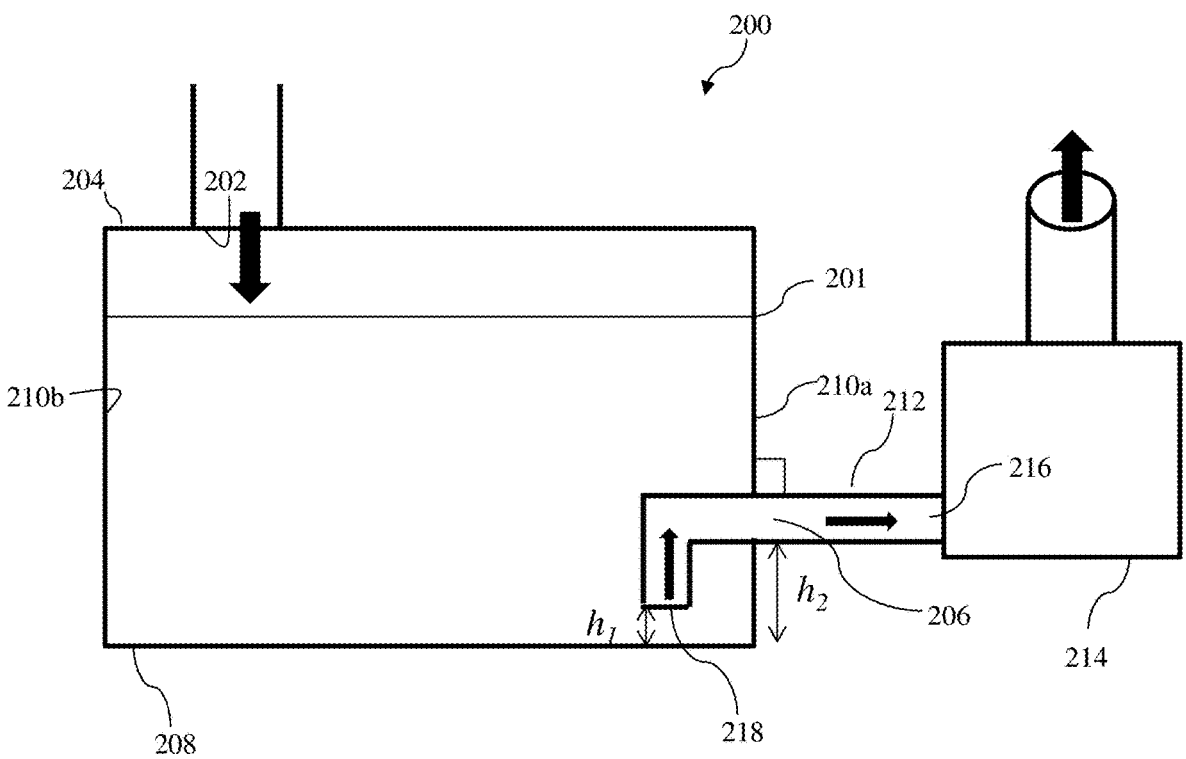
FIG. 3 shows a side-elevation view of a reservoir tank and a pump.

FIG. 3 shows a side view of a reservoir tank 200. As with the tank 100 in FIG. 1, a liquid may enter the tank 200 through an inlet 202 in the top 204 of the tank. The inlet may be positioned, alternatively, in a sidewall of the tank. The liquid conduit 212 is coupled to, and may pass through, the outlet aperture 206 in the side wall 210a. The outlet aperture 206 may be, alternatively, positioned in the floor, at an edge, or in a corner of the tank. The tank 200 may be sealed, such that substantially no gas or liquid can enter or leave the tank other than through the inlet 202 and the outlet aperture 206 through the wall 210a.

The liquid conduit 212 can extend from a first end to an opposed second end. The first end can be coupled with a pump such that an aperture 216 at the first end of the liquid conduit 212 is coupled directly or indirectly to an inlet to a pump 214. The liquid conduit 212 can extend through a side wall 210a such that the opposed second end of the liquid conduit 212 is positioned in the enclosure 200. An aperture 218 at the opposed second end can draw liquid from the enclosure into the passageway of the conduit. In another embodiment, the second end of the conduit 212 couples with the wall 210a, e.g., a flange on the wall. A second segment of conduit (not shown) can be coupled to the wall on an interior surface of the enclosure, and an opposed distal end of the second segment can be positioned as illustrated in FIG. 3. In general, the liquid conduit(s) may be coupled to the outlet aperture from the enclosure with a flange, a pipe nipple, welding, or any other coupling that allows the tank liquid to convey from the tank to the pump without leaking at the outlet aperture.

Another aperture, e.g., an aperture 218 at an opposite end of the conduit, may be positioned inside of the tank 200. And, instead of extending straight into the tank, the liquid conduit 212 may curve or bend such that the aperture 218 is downwardly facing and open toward the bottom 208 of the tank.

Liquid flowing through the aperture 218, e.g., being urged by a pressure differential between the free surface 201 and an inlet to the pump, into the conduit 212 will flow upward initially within the conduit, while liquid entering the tank 200 from the inlet 202 and flowing from the free-surface 201 to the inlet will flow downward, as shown by the arrows. Such a change in direction of the flow through the tank can disrupt and/or delay the onset of a swirling flow or a vortex that may otherwise cavitate or entrain gas from above the free surface 201.

In FIG. 3, the aperture 218 is positioned at an elevation $h_1$ above the bottom of the tank. The conduit 212 is positioned above the bottom of the tank by an elevation $h_2$, which is greater than $h_1$. Stated another way, the outlet aperture 206 through the reservoir wall 210a is positioned above (at a higher elevation than) the aperture 218 of the conduit relative to the floor (as defined by gravity) of the reservoir tank. The conduit 212 may be positioned through the outlet aperture 206 such that the conduit 212 is oriented perpendicularly or otherwise transversely relative to the side wall 210a. For example, the conduit 212 may be angled through the outlet aperture 206 such that the conduit 212 slopes up or down with respect to the tank.

The aperture 218 to the conduit 212 may have a planar orientation that is parallel to the bottom 208. Alternatively, the planar orientation of the aperture 218 may be angled with respect to the bottom, e.g., not parallel to the bottom. Although a planar aperture is described for succinctness and clarity, the aperture may be non-planar. As well, the aperture may be one of several or many apertures opening to the passageway 216 into the conduit. Further, additional curves or bends in the conduit 212 may be used to orient the aperture 218 relative to (e.g., to be parallel with or transverse to one of the side walls). Orienting the aperture 218 to face, and be parallel to, an opposite side wall 210b, however, may be less effective than a generally downwardly facing aperture (as in FIG. 3) at inhibiting swirling flows or gas entrainment, particularly if the aperture 218 is positioned relatively far from the inlet or a side wall (e.g., more than a selected number of (e.g., 1, 2, 5, 10) hydraulic diameters of the conduit), as such an orientation would be similar to having the aperture 218 at the tank outlet aperture 206. Orienting the aperture 218 to face, and be parallel to, the opposite side wall 210b, at a distance less than a characteristic dimension of a swirling flow, e.g., relatively close to or even behind the inlet relative to the outlet, may tend to disrupt the formation of a swirling flow and thus inhibit entrainment. Such a characteristic dimension may be a selected number of (e.g., 1, 2, 5, 10) hydraulic diameters of the conduit.

The aperture 218 may be angled relative to a longitudinal axis of an entry region to the conduit, for example, if the conduit is cut at an angle rather than perpendicularly as shown in FIG. 3. That is, for a cylindrical conduit, for example, the perimeter of the aperture 218 may be an ellipse rather than a circle when the aperture 218 is angled. For instance, the planar orientation of the aperture 218 may be angled with respect to the bottom 208 and/or the side wall 210a in order to cause the flow of the liquid to change direction sufficiently as it flows from the inlet 202 and into the conduit 212 to inhibit swirl and gas entrainment.

The conduit 212 may be made of a variety of materials suitable for conveying the liquid of the closed-loop system without contaminating the liquid or reacting with the liquid. The liquid may be, for example, a liquid coolant such as, by way of example, distilled water, ethylene glycol, propylene glycol, and mixtures thereof, or oil. The conduit 212 may be rigid, e.g., stainless steel, polyvinylchloride (PVC) pipe, or may be flexible, e.g., silicone or vinyl tubing, including with a braided sleeve.

The aperture 218 may be funnel-shaped, e.g., wider than a diameter of the conduit 212 at an outer edge and narrowing to the diameter of the conduit 212. The aperture 218 may also be fluted, e.g., have ridges or grooves, which may further direct the liquid flow and inhibit flow separation and cavitation at the aperture.

Accordingly, the shape and positioning of the conduit 212 may inhibit or reduce cavitation. Alternatively, or in addition, the shape and positioning of the conduit 212 may at least move a cavitation zone away from the pump, to the extent that cavitation is not completely inhibited.

Figure 4:
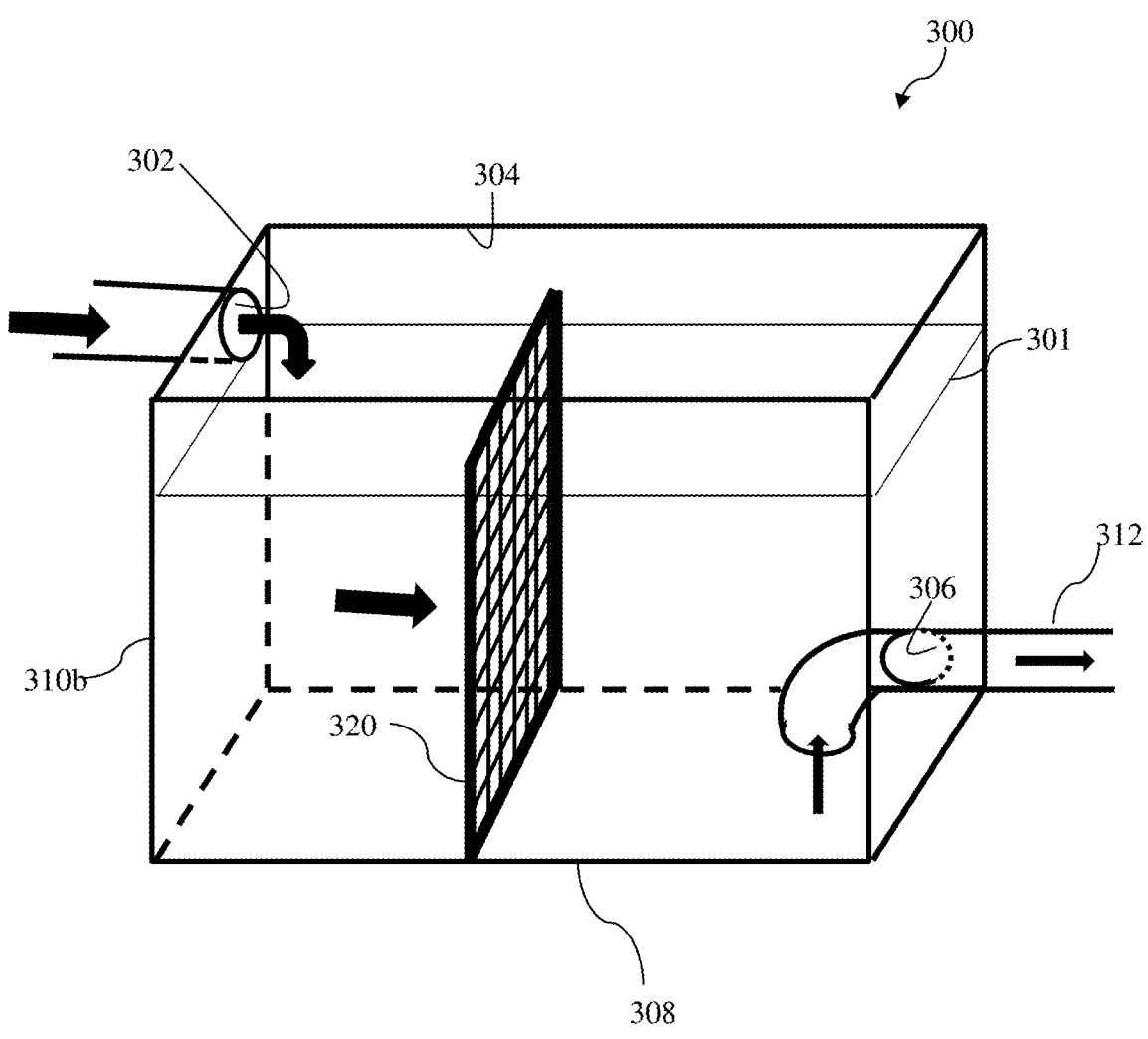
FIG. 4 shows an isometric view of another reservoir tank having a baffle.

FIG. 4 shows an isometric view of an embodiment of a reservoir tank 300. As shown, the tank 300 has an inlet 302 positioned in a side wall, e.g., side wall 310b, above a free surface 301 of the liquid, instead of in the top 304, although the inlet 302 could be positioned in the top 304 or below the free surface 301 of the liquid. The tank 300 also has an outlet aperture 306 through which a conduit 312 passes or to which conduit segments attach, analogously to the conduits described in relation to FIG. 3. The outlet aperture 306 may be positioned, alternatively, in the floor, a different side wall, at an edge or in a corner of the tank. The conduit 312 may be curved so that the aperture of the conduit is oriented to face the bottom 308 of the tank.

The tank 300 may also have a baffle 320 positioned in the tank. In FIG. 4, the baffle 320 is oriented vertically in the tank relative to gravity. In particular, the illustrated baffle extends from one interior wall to another, opposed interior wall. In FIG. 4, the baffle 320 is oriented parallel to a selected pair of opposed walls and transversely to each remaining interior wall. Of course, the baffle 320 may be selectively oriented relative to each of the walls and the baffle 320 is illustrated as being planar, though it need not be planar.

The baffle 320 may include a number of apertures through which the liquid can flow. The baffle 320 may be positioned between the inlet 302 and the outlet 306. Each of the apertures in the baffle 320 has a hydraulic diameter. The hydraulic diameter ($D_h$) of a conduit or other flow path is, generally, proportional to a ratio of the cross-sectional area (A) of the conduit or other flow path to the wetted perimeter (P) of the cross-section, i.e., $D_h$=4 A/P. For a circular tube, the hydraulic diameter is simply the inside diameter of the tube.

The baffle 320 may extend, for example, from one side wall to an opposing side wall, and from the floor to above the free surface of the liquid, such that all liquid from the inlet 302 must flow through the baffle 320 to reach the outlet 306 (or at least the entrance to the conduit 312). Alternatively, the baffle 320 may extend or be positioned such that some liquid can pass from the inlet to the outlet around an outside perimeter of the baffle, for example, through a gap between the baffle and a sidewall, through a gap between the baffle and the floor, or through a gap between the baffle and the free surface 301 of the liquid.

The use of a baffle 320 may inhibit entrainment of the gas present in the top of the tank, i.e., above the free surface 301. The hydraulic diameter of the apertures in the baffle 320 may be generally much smaller than the cross-sectional area of the liquid-filled part of the tank. The small-area apertures through the baffle (e.g., as defined by a wire or other mesh) may disrupt swirling flows having a characteristic dimension on the order of a hydraulic diameter of the conduit 312 inducing disorganized, small-scale swirling flows and enhancing mixing of the liquid in the reservoir as it flows from the inlet to the outlet.

As noted, the flow of the liquid from the inlet 302 toward the outlet 306 must pass through small flow paths, e.g., through apertures in the baffle, through small gaps positioned around the baffle, or both. The apertures may change a direction of flow, at least locally (e.g., in regions adjacent the baffle), thus disrupting the potential for a vortex to form. The top of the baffle 320 may extend above the maximum liquid level 301 as shown, or may be positioned at or below the maximum liquid level 301.

Figure 5:
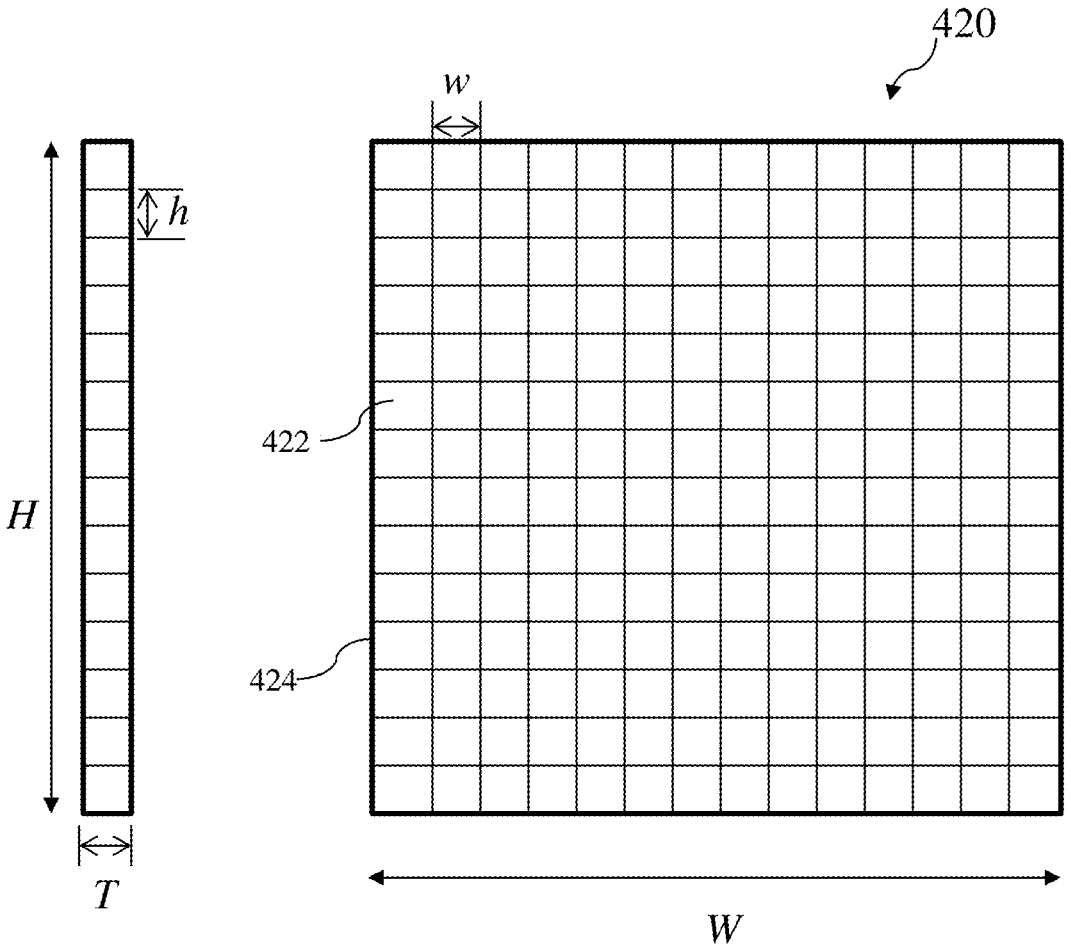
FIG. 5 shows aspects of a baffle.

FIG. 5 shows an example of a baffle 420 in a side-elevation view on the left and in a front plan view on the right. The baffle 420 may be an example of the baffle 320. The baffle 420 may have a height H, a width W, and a thickness T. The height H may be selected to be at least as high as the intended depth of the liquid of the tank at the free surface 301. However, since the liquid level of the tank may vary somewhat with the conditions of the system, the height H of the baffle 420 may be larger than a maximum intended or likely liquid depth, and may be close to, or the same as, the total inside height of the tank. The height H may be approximately the same as a maximum intended liquid level height of the tank. In some instances, the baffle may be vertically oriented in the tank and spaced apart from the bottom 308 such that the baffle extends partially above the maximum liquid level height and does not contact the bottom of the tank.

The width W of the baffle 420 may be selected such that the baffle spans the tank from one side wall to an opposing side wall. The width W need not completely span the width of the tank, and the bottom of the baffle 420 need not contact the bottom of the tank, so long as the baffle 420 is retained in a selected position and orientation, and prevented from moving out of position. Some liquid flow around the outer edges, outside of the apertures, may be permissible as such flow may not be likely to cause or allow entrainment of a gas or induce a swirling flow having a characteristic diameter on the same order of size as the hydraulic diameter of the conduit. Generally, the width W of a baffle may be substantially constant along its height, although in some cases, the width may vary, e.g., the baffle may be tapering, or undulating, for example, if the side walls of the tank are not substantially parallel with each other.

As shown, the baffle 420 has a plurality of rectangular apertures, each having a height h and a width w, as well as a length T. The hydraulic diameter of an aperture 422 is, accordingly, $4(w*h)/2(h+w)$. If h=w, then the hydraulic diameter is simply h. As shown, the apertures all have the same hydraulic diameter. However, in other examples, the apertures within one baffle may have different respective hydraulic diameters. The apertures may be arranged in a pattern, e.g., in increasing diameter from a center of the baffle radially outward, in increasing diameter from the top of the baffle to the bottom (or from the bottom to the top, left to right, or right to left), alternating rows, columns, or rings of relatively large diameters with relatively smaller diameters, and so forth. In still other examples, the apertures may be randomly or pseudo-randomly arranged, e.g., with no specific or discernable pattern. As well, although rectangular apertures 422 are illustrated, the apertures need not be rectangular. Rather, they may be circular, elliptical, rhomboid, or any other regular or irregular shape.

The baffle 420 may include a frame 424. The frame 424 may define a perimeter extending around the apertures 422 and provide structural support to prevent the baffle from folding, bending, or otherwise distorting in the liquid flow. The frame 424 may also provide a permanent or detachable means of fixing the baffle to the tank. For example, the frame 424 may fit inside and/or be held by clips, clasps, tracks, rails, springs or other fastening mechanisms in the tank itself. The frame 424 may, alternatively, be made of a material or be coated in a material, e.g., silicone or rubber, that hold the baffle in place via friction between the frame and the sidewalls. The frame 424 may be naturally wider than the inside width of the tank, but sufficiently compressible, e.g., resiliently compressible, to be placed in the tank, and allowed to decompress such that it urges against and stays fixed to the side walls in a compressed arrangement with the side walls.

The baffle 420 may be made from a variety of materials, including, but not limited to, plastic, steel, stainless steel, polymerized rubber, and aluminum. The baffle 420 may include a woven mesh or screen defining the apertures 422, in which case a thickness T of the baffle 420 may be negligible, e.g., a flow length of the apertures 422 may be negligible. The baffle 420 may be made from expanded metal in another embodiment. The baffle 420 may be extruded or 3-D printed plastic. In addition to squares or rectangles, other cross-sectional shapes are possible, including as discussed with respect to FIG. 13.

Figure 6:
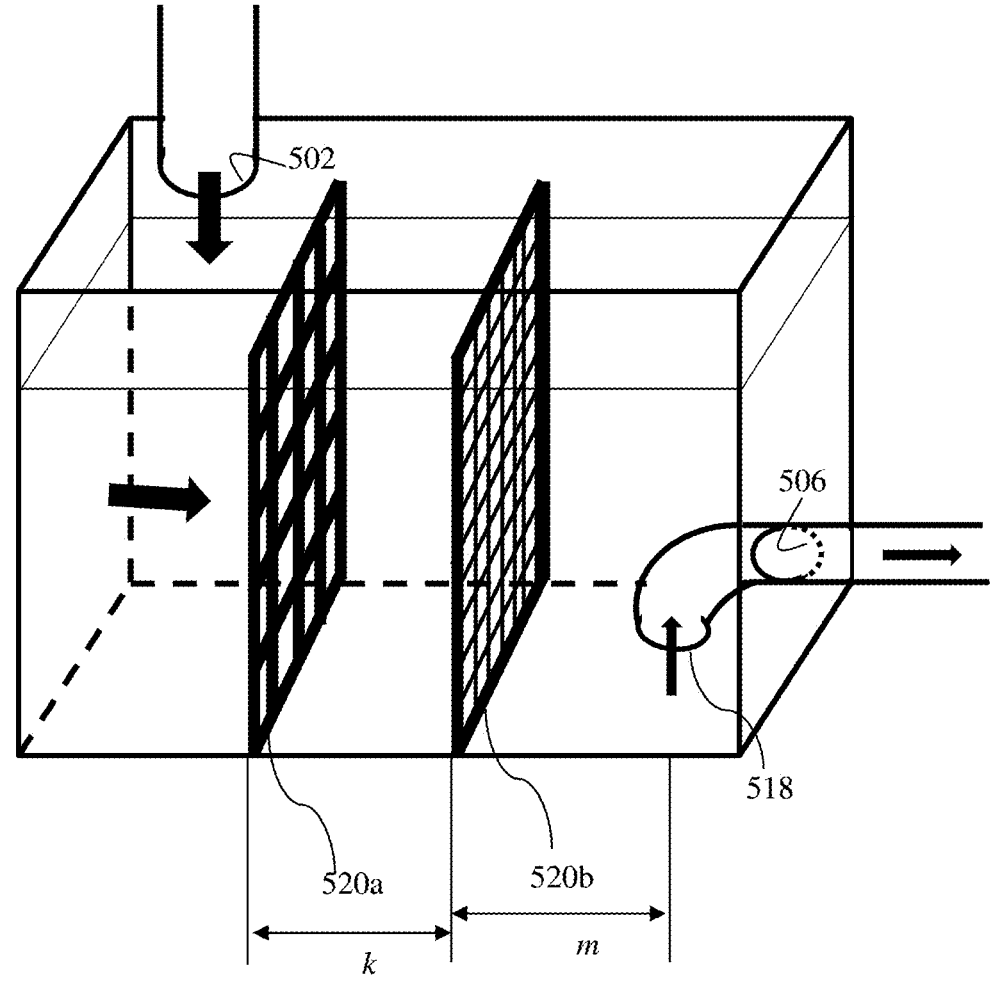
FIG. 6 shows a reservoir tank having two baffles, with each oriented vertically.

FIG. 6 shows an embodiment using two vertically oriented baffles 520a and 520b. In an example, the hydraulic diameter of the apertures in the baffle 520a may be different from the hydraulic diameter of the apertures in the baffle 520b. Alternatively, the hydraulic diameters of the apertures in each baffle may be the same. When the respective hydraulic diameters of the baffles differ, the flow of the liquid from the inlet to the outlet may be disrupted differently by each baffle, further reducing the ability of a large vortex or other large-scale swirling flow to form.

The baffles 520 may be separated by a distance k. The baffle closest to the exhaust aperture 518 may be separated from the aperture, e.g., from a midpoint or center of the aperture, by a distance m. The distances k and/or m may be selected based on the hydraulic diameter(s) of the apertures 422 in each baffle 520a, 520b and the exhaust aperture 518, a flow rate of the liquid, and/or the thickness of the baffles.

Figure 7:
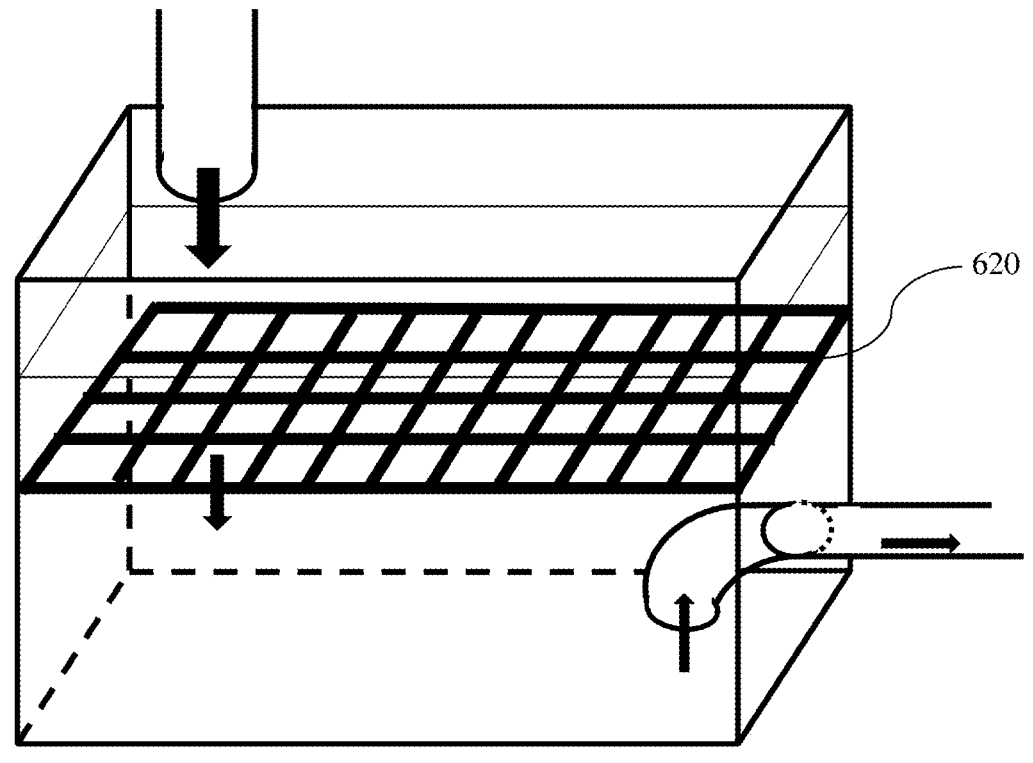
FIG. 7 shows a reservoir tank having a horizontally oriented baffle.

FIG. 7 shows an alternative example where a baffle 620 is horizontally oriented relative to gravity so that the baffle 620 is parallel to the bottom of the tank, but still positioned between the inlet and the outlet of the tank. In such an example, the baffle 620 may have sufficient thickness T and/or have a cross-sectional shape to direct the flow of water through the apertures downward without generating a vortex. For instance, apertures through the baffle 620, as with apertures through any baffle described herein, may be slanted or oriented transversely relative to a plane of the baffle. As well, adjacent apertures through the baffle need not be oriented in the same direction. Rather, a plurality of baffles may also be used, as in FIG. 6, where at least one of the baffles is horizontally oriented as in FIG. 7.

In some cases, a combination of differently oriented baffles may be used, for example, a horizontal baffle and a vertical baffle, or a first baffle oriented at a first angle from a vertical orientation and a second baffle oriented at a second different angle from a vertical orientation where the two baffles are not orthogonal to each other. Other orientations may be used, for example, orientations that keep the baffle oriented generally orthogonally to the flow of the liquid.

Figure 8:
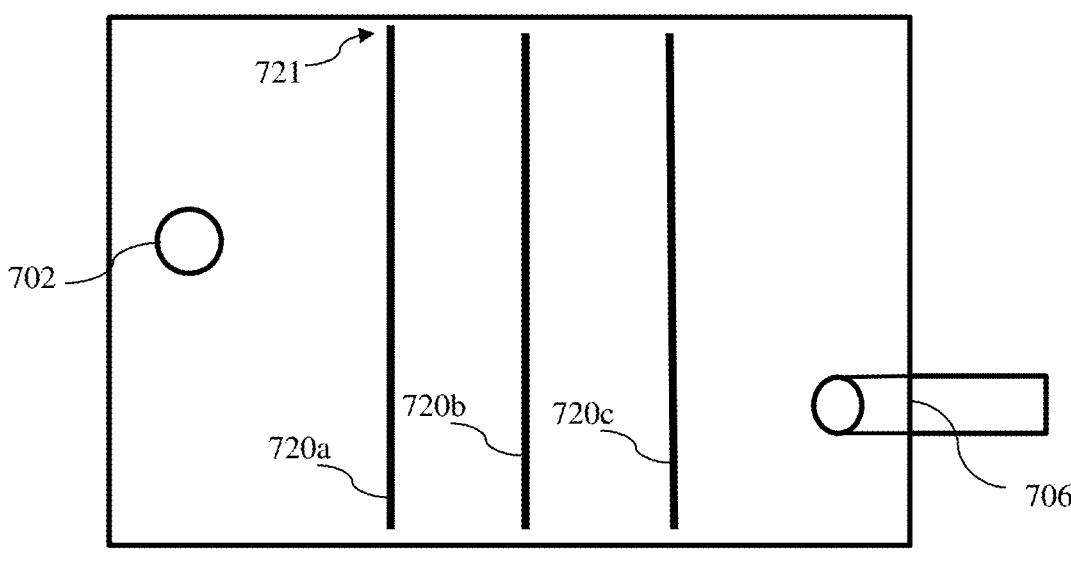
FIG. 8 shows a top-down view of a reservoir tank having three vertically oriented baffles. The baffles are substantially orthogonal to selected side walls of the reservoir tank.

FIG. 8 shows a top-down view of a tank where three vertically oriented baffles 720a-c are used. As shown, the baffles 720 do not extend the entire width of the tank, allowing some of the liquid from the inlet 702 to flow to the outside of the baffles 720 through a gap 721 between a perimeter of the baffles and an adjacent side wall of the enclosure before reaching the outlet 706. In other examples, the baffles 720 may span the distance between the side walls fully. The hydraulic diameter of the apertures of baffle 720a may be different than the hydraulic diameter of the apertures in baffle 720b, which may be different than the hydraulic diameter of the apertures in baffle 720c. In an example, the baffles 720 may be arranged in order of decreasing hydraulic diameter from the inlet 702 to the outlet 706. Alternatively, the baffles may be arranged in order of increasing hydraulic diameter from the inlet to the outlet. The baffles may be arranged such that the changes in velocity of the flow inhibit entrainment and cavitation. As well, the apertures through the baffles 720a-720c need not be aligned with each other or oriented perpendicularly to a plane defined by the corresponding baffle. Rather, some or all of the apertures in a given one of the baffles may be slanted (e.g., oriented transversely but not perpendicularly) relative to the plane defined by the respective baffle. Alternatively, the baffles may be oriented in a slanted fashion relative to one or more side walls of the enclosure, as shown by way of example in FIG. 9.

Figure 9:
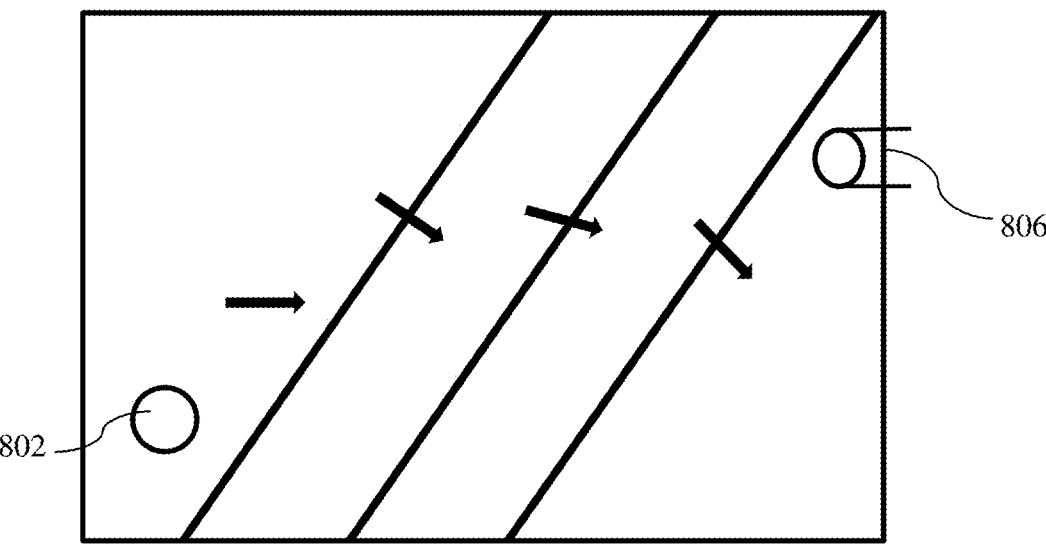
FIG. 9 shows a top-down view of another reservoir tank having three vertically oriented baffles oriented at obtuse-acute angles relative to selected side walls.

FIG. 9 shows a top-down view of a tank where three baffles are positioned vertically and oriented at a non-perpendicular angle relative to the side walls. Such an arrangement may allow the use of a baffle with a larger surface area relative to a baffle arranged perpendicularly as in FIG. 8. When the thickness T of the baffle is non-negligible, the orientation of the apertures may change the direction of the liquid flow away from a direct flow from inlet 802 to outlet 806, as shown by the arrows, which may further inhibit or prevent entrainment. Each respective baffle may change the direction of the liquid flow to a different direction than an adjacent baffle, enhancing mixing of the liquid as it passes through the tank.

Figure 10:
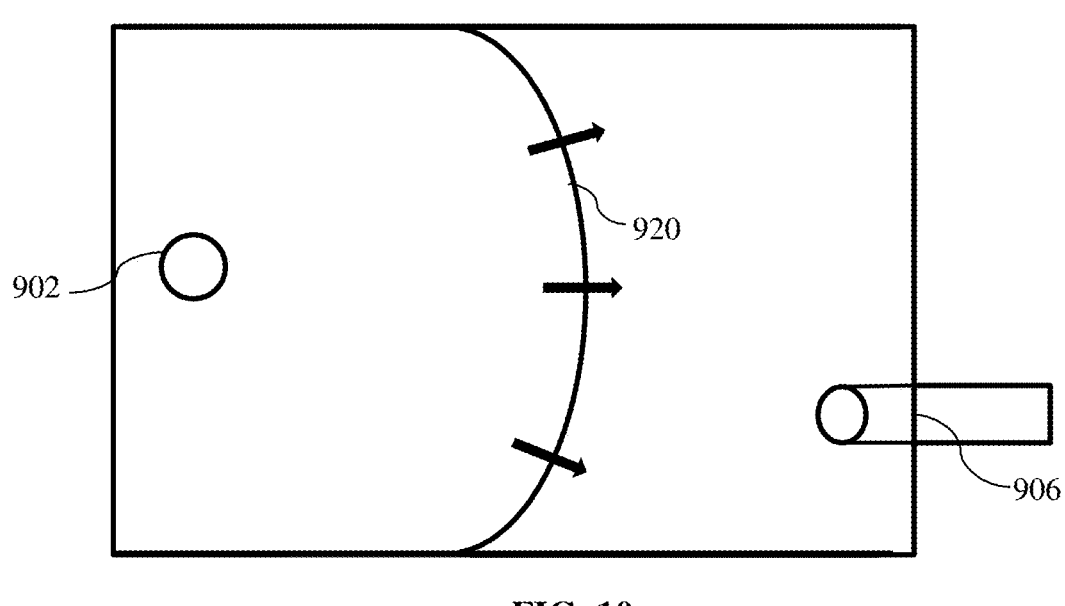
FIG. 10 shows a top-down view of a reservoir tank having a curved baffle.

FIG. 10 shows a top-down view of a tank where a curved baffle 920 is used in a vertical orientation. The baffle may be curved convexly toward the outlet 906 as shown, or may be curved concavely toward the outlet (not shown). The apertures in the curved baffle may be oriented radially (e.g., perpendicularly to a surface of the baffle) such that the flow of the liquid through the baffle disperses or converges somewhat as shown by the arrows, which may disrupt flows that might entrain the gas. Additional curved or non-curved baffles may be used in combination.

Figure 11:
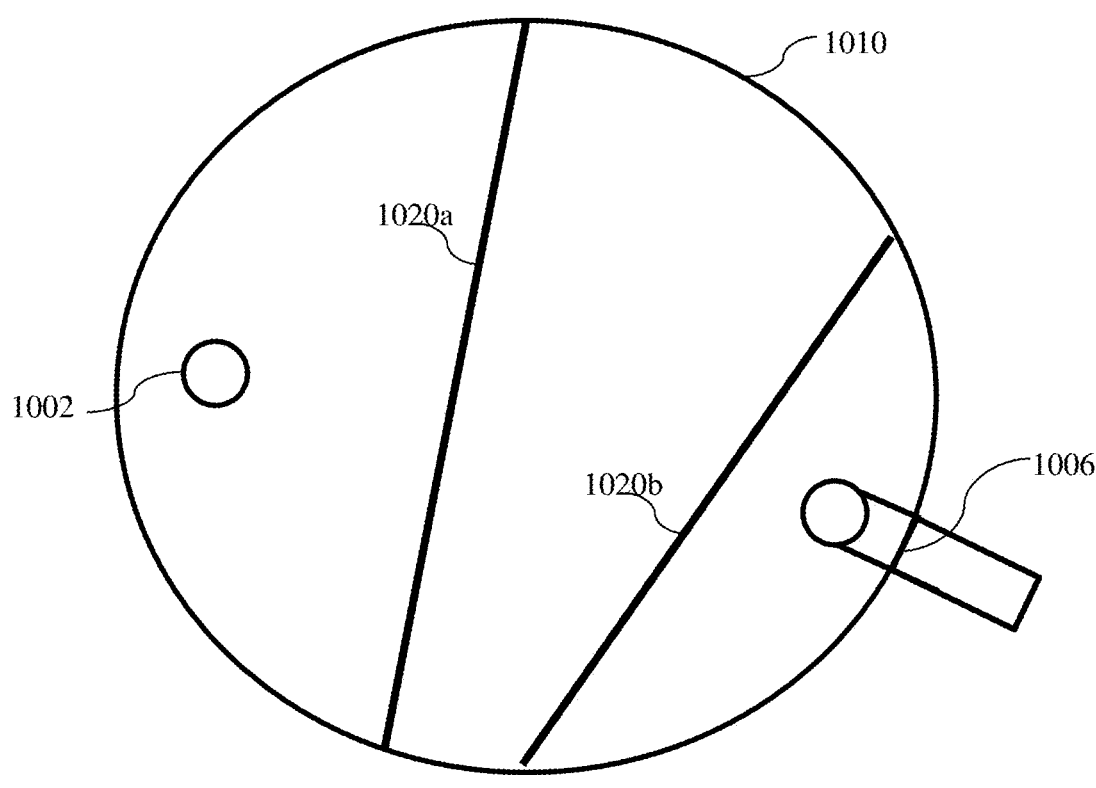
FIG. 11 shows a top-down view of a reservoir tank having a singular circular or ovoid cross-section, and where two baffles are used.

FIG. 11 shows a top-down view of a tank having a singular circular or ovoid side wall 1010, and where two baffles 1020a, 1020b are used. The apertures in one of the baffles 1020 may have the same hydraulic diameter as the apertures in the other of the baffles, or may have differing hydraulic diameters. Further, the baffles need not be parallel to each other.

Figure 12:
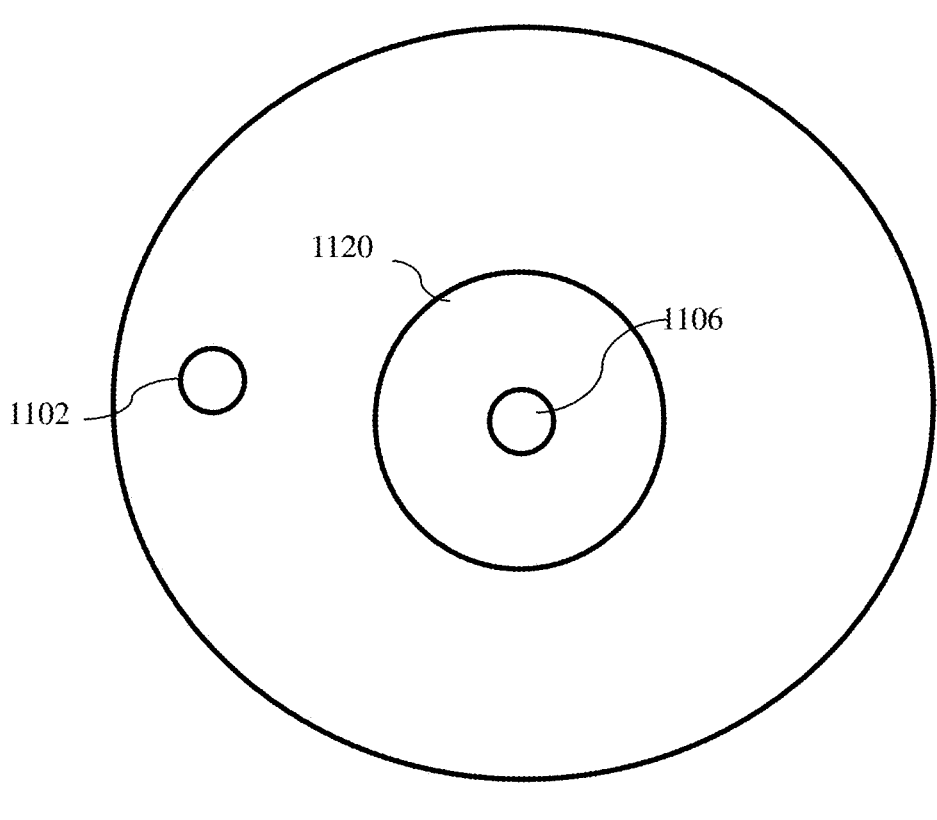
FIG. 12 shows a top-down view of a cylindrical reservoir tank.

FIG. 12 shows a top-down view of a cylindrical tank. The outlet 1106 can be positioned on the bottom of the tank, as a drain. Alternatively, a U-shaped snorkel (not shown) can attach to the outlet 1106 and extend inwardly of the enclosure, such that an entrance to the snorkel requires a change in flow direction as the liquid flows from the inlet 1102 to the outlet 1106, as with the snorkel shown in FIG. 3. The baffle 1120 may be circular, ovoid, rectangular, semispherical or have any other shape that extends around the outlet 1106 (or snorkel) to disrupt a flow of the liquid. In an example, the baffle may be centered on the outlet 1106. Alternatively, the baffle 1120 may have its center offset from the center of the outlet 1106. The apertures in the baffle 1120 may be configured to prevent or inhibit a swirling liquid flow from forming. For example, some of the apertures may be blocked, or the apertures may be oriented to direct the flow of the liquid away from the outlet 1106, or at least not directly radially toward or circumferentially around the outlet 1106.

The examples are not limited to the illustrated examples above of tank shapes and baffle configurations. More or fewer baffles may be used. The shape of the apertures of one baffle may differ from the shape of the apertures of another baffle, and may or may not have the same hydraulic diameter. Two or more baffles used in one tank may have different thicknesses. When three or more baffles are used in one tank, they may be spaced apart equidistantly, or may have varying separation distances.

A tank may be a spherical tank. In a spherical tank, references to a side wall, top and bottom may be interpreted to refer to the portions of the sphere in relation to its position with respect to the ground or floor of its environment. That is, the bottom may be the part of the sphere closest to the floor, the top is the portion of the sphere opposite the bottom, and the sidewall may be the portions of the spherical surface between the top and bottom. Naturally, other shapes of tanks are possible and known, and the concepts described herein can be incorporated in such tanks without departing from principles described herein.

Figure 13A:
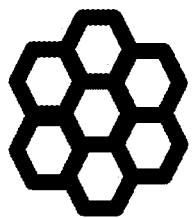
FIGS. 13A-C shows examples of different shapes of baffle apertures.
Figure 13B:
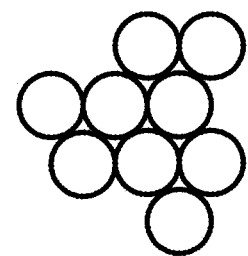
Figure 13C:
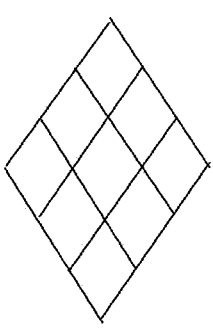

FIGS. 13A-C show examples of baffle apertures. Baffles may have, for example and without limitation, hexagonally shaped apertures as in FIG. 13A, circular apertures as in FIG. 13B, or rhomboid apertures as in FIG. 13C. The walls of the apertures may be relatively thick with respect to the hydraulic diameter, as in FIG. 13A, or may be thin relative to the hydraulic diameter, as in FIG. 13C. The examples are not limited to the illustrated shapes.

Figure 14:
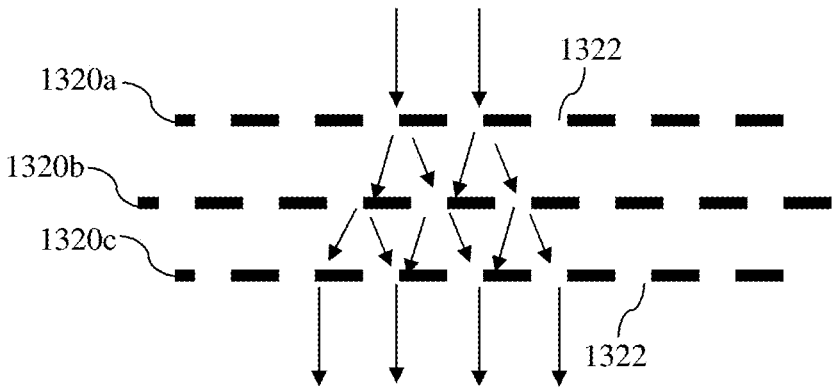
FIG. 14 shows an example of a series of baffles having offset apertures.

FIG. 14 shows an example of a series of baffles 1320a, 1320b, 1320c with offset apertures 1322. As liquid passes through the offset apertures, streamlines through one aperture 1322 (e.g., in baffle 1320a) diverge and the flow from that aperture passes through, for example, two different apertures through an adjacent baffle (e.g., baffle 1320b). Such breaking apart of streamlines encourages liquid mixing and inhibits or prevents formation of large-scale flow structures (e.g., swirling flows, vortices, etc.) that may entrain gas or induce cavitation. The cascading arrows illustrate such breaking apart of streamlines and mixing.

The apertures 1322 may have the same hydraulic diameter. Alternatively, the apertures of a baffle, e.g., baffle 1320a, may have a different hydraulic diameter than the apertures of another baffle, e.g., baffle 1320b. The baffles 1320 may be arranged such that the apertures 1322 of one baffle do not align with the apertures of an adjacent baffle. This may disrupt the flow of the water, as shown by the arrows, sufficiently to inhibit entrainment or cavitation.

In some cases, the baffles may also inhibit or reduce cavitation. The baffles affect the flow direction and the flow speed and thus may align flow stream lines to reduce or eliminate pressure differentials that are created when the liquid flows from the relatively larger volume of the reservoir into the relatively smaller volume of the aperture, outlet and liquid conduit.

Fill Kit and Control Logic for Automated Filling of a Closed-Loop Liquid System

Closed-loop liquid systems, such as a liquid-based heat transfer system or a hydraulic system, usually include a reservoir for the liquid, and one or more pumps to move the liquid from the reservoir to the other components of the system through liquid conduits. After initial assembly, the pumps, conduits and reservoir usually contain gas, e.g., air. The pumps are designed to move liquid through their impellers, and may overheat or otherwise be damaged if operated while filled with a gas for too long of a duration. Initially filling a closed-loop liquid system conventionally requires human intervention. Conventionally, a source of the liquid is connected to the system, e.g., to the reservoir, and the pumps are operated by a skilled technician to fill the system gradually without burning out the pumps. For example, a technician may turn the pumps on for a short period of time and then off, referred to as "bumping" the pump. The brief period of time that the pump operates may allow some liquid to be drawn into the conduits but without over-heating the pump. The off period may allow the pumps to cool if heating has occurred. Repeatedly bumping the pumps eventually fills the system with the liquid. The gas in the system is usually allowed to escape, for example, by a valve positioned somewhere between the pumps and a return to the reservoir. Human supervision has been necessary to ensure that the pumps do not operate for too long of a period while dry, however, this can increase the costs to the owner of the closed-loop liquid system and/or may delay the start of using the system.

Figure 15:
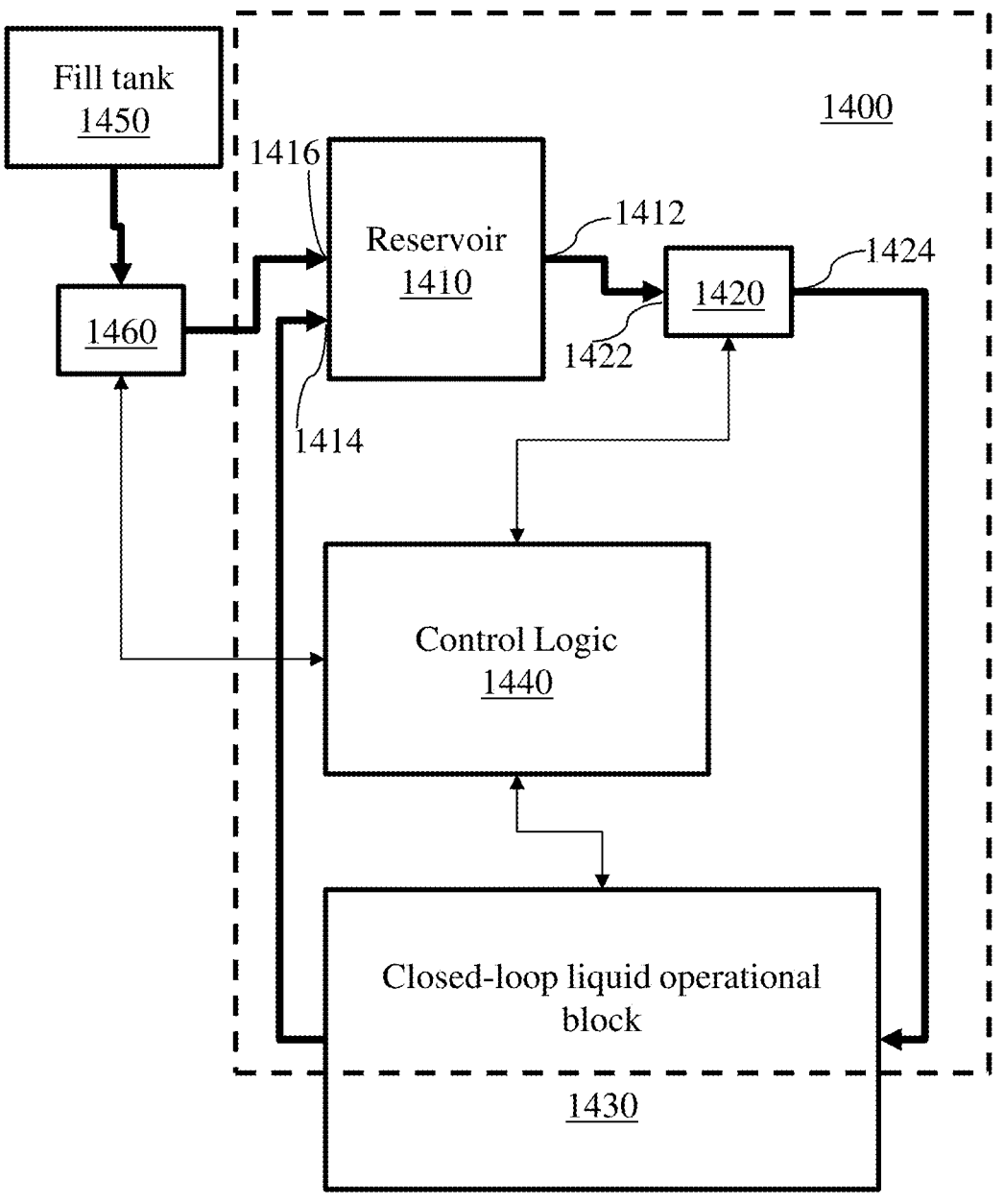
FIG. 15 shows a block diagram of a closed-loop liquid system having a fluid conditioning unit.

FIG. 15 shows a block diagram of an example of a fluid conditioning unit 1400 as may be used in a closed-loop liquid system. The fluid conditioning unit 1400 may include a reservoir 1410, a pump 1420, a closed-loop liquid operational component 1430 and control logic 1440. During an initial filling process, a fill tank 1450 and a fill pump 1460 may be coupled to the fluid conditioning unit 1400.

The reservoir 1410 may be a tank configured to hold a liquid for the closed-loop liquid system, e.g., a coolant, water, hydraulic fluid, or oil. The reservoir 1410 may have an outlet 1412 that is fluidically coupled to the pump 1420, e.g., with a hose, a pipe, tube or other fluid conduit. The reservoir 1410 may have an inlet 1414 that is fluidically coupled to the operational component 1430 to receive the liquid after it has flowed through the system. When the system is filled to an operational capacity, the reservoir 1410 may contain the liquid of the system and some amount of gas, such as, for example, air, to accommodate changes in temperature, pressure and volume in the system while in operation. Other than any inlets and outlets, the reservoir may generally be sealed to prevent or reduce evaporation and spills of the liquid contained by the reservoir.

The pump 1420 may be configured to move liquid from a pump inlet 1422 through a pump outlet 1424 and urge the liquid from the pump to the operational block 1430. The pump 1420 may be powered, e.g., electrically, so that it can be started and stopped to activate and deactivate the flow of liquid. Additionally, the speed of the pump 1420 may be controllable, for example, by varying an amount of power supplied to the pump or by a separate control signal (e.g., using a variable-frequency drive). The pump 1420 may be, for example, a centrifugal pump or a positive displacement pump.

The closed-loop liquid operational block 1430 represents a region of a general closed-loop liquid system where the liquid or a flow of the liquid performs a function. In one embodiment, the closed-loop liquid system is a heat-transfer system that absorbs heat from one or more heat sources and dissipates the heat to one or more heat sinks.

For example, in a liquid-cooled heat exchange system, the operational block 1430 may represent, at least, fluid conduits containing a liquid coolant, heat exchanger components in thermal contact with the fluid conduits, and/or heat dissipating elements. For example, in the operational block 1430, a heat exchanger may be in thermal contact with a heat-dissipating element, such as a processor. Energy may conduct (e.g., diffuse) from the walls of the heat exchanger into adjacent fluid particles of a liquid coolant within the fluid conduits, and the adjacent fluid particles are swept away from the wall, or advected, carrying the energy absorbed from the walls. The swept-away particles are replaced by other, usually cooler fluid particles, which more readily absorb energy from the walls (e.g., by virtue of their usually lower temperature). Such a combination of conduction and advection (i.e., convection) provides an efficient approach for cooling devices having a relatively high heat flux, such as, for example, electronic devices. After passing through the plurality of passages in the heat exchanger, the heated liquid coolant may pass to another heat exchanger, carrying with it the energy absorbed from the first heat exchanger. As the heated coolant passes through the second heat exchanger, energy is rejected from the coolant (e.g., to another working fluid, such as, for example, the air, or a building's water supply) through convection processes similar to those described above. From the second heat exchanger, the cooled working fluid may be pumped back to the first heat exchanger.

The closed-loop liquid system may be a hydraulic system. For example, in a hydraulic system, the operational block 1430 may represent, at least, conduits and chambers where a hydraulic fluid is pressurized to apply a force to a member. When the liquid has performed its function, it may return to the reservoir 1410 at the inlet 1414.

The control logic 1440 (or any other control logic described herein) may include instructions, e.g., stored on a memory, and a processing unit configured to execute the instructions. The control logic 1440 may be communicatively coupled to the pump 1420. The control logic 1440 may, for example, be configured to start and stop the pump 1420. The control logic 1440 may receive information from the pump 1420 or from a sensor observing an operational parameter about the pump. Such sensors can include, among others, a temperature sensor so positioned relative to a fluid as to provide a signal corresponding to a temperature of a fluid within the conduit or a temperature of a surface, a pressure sensor so positioned as to provide a signal corresponding to a relative pressure difference between a static pressure in a liquid and a selected reference pressure, a speed sensor (e.g., a tachometer) configured to provide a signal corresponding to a rotational speed of a pump, a float sensor or other sensor configured to provide a signal corresponding to a coolant level in the reservoir, and a humidity sensor configured to provide a signal corresponding to one or more of an absolute humidity, a relative humidity, a wet-bulb temperature and a dry-bulb temperature. In general, such a sensor can observe a thermodynamic quantity, or an operational parameter indicative of a thermodynamic quantity.

The control logic 1440 may be communicatively coupled to the operational block 1430. The control logic 1440 may receive information from one or more sensors within the operational block 1430. For example, the received information may include temperature, pressure, flow rate, or a liquid level at one or more points in the block, or any other thermodynamic quantity relating to the flow or a condition of a component in the conditioning unit 1400, the pump 1460, or the fill tank 1450.

The control logic 1440 may be communicatively coupled to the various components of the fluid conditioning unit 1400 through a wired connection, a wireless connection, or both. A communication bus may be configured to send and receive control signals and sensor information to and from a processing unit and/or memory of the control logic. Such signals can include any type of signal suitable for conveying information, including wired and wireless signals, e.g., radio frequency (RF), infrared (IR), microwave and photonic signals.

During an initial filling operation, the fluid conditioning unit 1400 may be connected to a fill tank 1450 and a fill pump 1460. The fill pump 1460 may be fluidically coupled to the reservoir 1410, for example, at a supply inlet 1416 by a coupling. The coupling may be reversibly detachable. The fill pump 1460 may be fluidically coupled to the fill tank 1450 and may operate to pump liquid from the fill tank 1450 into the reservoir 1410. The fill tank 1450 may hold an amount of liquid sufficient to fill the fluid conditioning unit 1400, including the reservoir 1410, while allowing some gas to remain in the reservoir.

In reference to a filling operation, the terms "enough," "sufficient," or "filled" may refer to an amount of liquid such that all of the liquid conduits and fluidically coupled components in at least the fluid conditioning unit, or in the entire closed-loop system between the outlet of the reservoir and the inlet of the reservoir contain liquid and only a negligible amount of gas. A negligible amount of gas may remain in the system in the form of, for example, micro-pockets of gas present because the surface tension of the liquid prevents the liquid from filling the pocket. The reservoir itself may contain liquid to a specified level, with some amount of gas (e.g., to accommodate expansion and contraction of the liquid). In some cases, the terms may refer to an amount of liquid in the pump 1420 and upstream from the pump such that the pump can operate continuously without overheating, although the rest of the system downstream from the pump may not yet be liquid-filled.

During the initial filling operation, the control logic 1440 may be communicatively coupled to the fill pump 1460. This may allow the control logic 1440 to start and stop the fill pump 1460 to maintain sufficient liquid in the reservoir while the rest of the fluid conditioning unit 1400 fills. Additionally, the control logic 1440 may "bump" the pump 1420 to move liquid from the reservoir through the rest of the fluid conditioning unit 1400. During the initial filling operation, the control logic 1440 may use information received or measured about one or more operational parameters to determine whether the fluid conditioning unit 1400 is filled, without the need for human intervention. An operational parameter that meets a threshold value may indicate that a sufficient amount of liquid has moved through the pump 1420 and the component 1430 to indicate that the system is filled.

The control logic 1440 may also be communicatively coupled to a valve (not shown) positioned between an outlet of the pump 1420 and the inlet 1414 to the reservoir. The control logic 1440 may communicate a signal to the valve to cause the valve to open, to release gas from within the system.

When the initial filling operation is completed, the fill pump 1460 and fill tank 1450 may be decoupled from the reservoir 1410 and the control logic 1440 may be communicatively decoupled from the fill pump 1460. For example, a coupling between the reservoir and the fill pump 1460 may be detached, or a valve between the fill pump and the reservoir may be closed. Communicatively decoupling the control logic from the fill pump nay include, for example, closing a wireless communication channel, disconnecting a wired communication coupling, or turning off power to the fill pump so that it is not capable of receiving, responding to, or sending communication signals.

According to an aspect, the fill pump 1460 can be omitted. For example, the fill tank 1450 can be elevated relative to the reservoir 1610. A syphon can draw coolant into the reservoir. The remainder of the flow paths throughout the fluid conditioning unit can be filled as described elsewhere herein.

Figure 16:
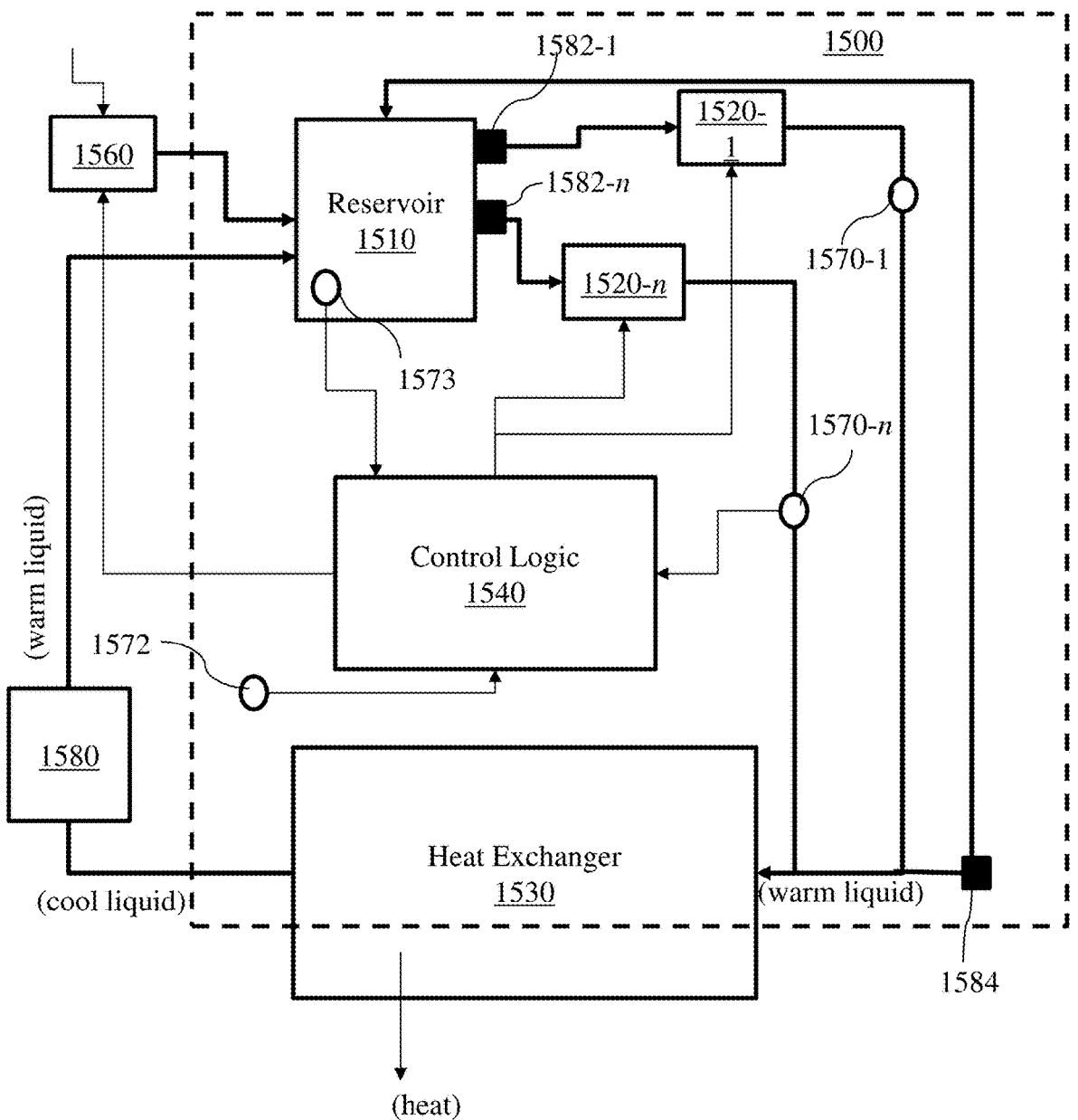
FIG. 16 shows a block diagram of a closed-loop liquid system that is a liquid-cooled heat exchange system having a fluid conditioning unit.

FIG. 16 shows a block diagram of a fluid conditioning unit 1500 used in a liquid-cooled heat exchange system. The fluid conditioning unit 1500 may include one or more pumps, e.g., pumps 1520-1 to 1520-$n$, where n represents a positive integer. Heated coolant may be cooled in the heat exchanger 1530 before being provided to a heat transfer element 1580. The heat transfer element 1580 may represent one or more devices or systems that dissipate heat to the coolant. The warmed coolant is returned to the reservoir 1510.

The fluid conditioning unit 1500 may include one or more sensors positioned in various parts of the system. For example, each pump 1520-1 . . . 1520-$n$ may have an associated sensor 1570-1 . . . 1570-$n$, where each respective sensor 1570 may observe or detect an operational parameter related to the pump or to the liquid outflow from the pump, such as, for example, flow rate, temperature, pump speed, or pressure. A sensor 1572 may be associated with a supply line conduit carrying liquid out from the heat exchange component 1530. The sensor 1572 may, for example, detect or observe temperature, pressure or flow rate in the supply line. A sensor 1573 may be associated with the reservoir 1510 and may detect or observe, for example, a liquid level, a liquid mass, a liquid volume, and/or a liquid temperature for the liquid in the reservoir. More, fewer, or other sensors may be used in the system.

Information detected or observed by the sensors 1570, 1572, 1573 may be communicated to the control logic 1540. During an initial filling operation, the control logic 1540 may use the received information to determine whether the fluid conditioning unit 1500 is filled. In an embodiment, the control logic 1540 may rely on a single operational parameter, for example, a pressure measurement from the sensor 1572 to determine that the fluid conditioning unit 1500 is filled. A pressure measurement from the sensor 1572 that meets a threshold value may indicate that a sufficient amount of liquid has moved through the pumps and the component 1530 to exert the pressure at the sensor 1572, indicating that the system is filled. In another embodiment, the control logic 1540 may use a combination of sensor information to make that determination. For example, the pressure from the sensor 1572 and a liquid level measurement from the sensor 1573 may be used. While there may be sufficient liquid in the fluid conduits in the fluid conditioning unit 1500, the reservoir may not yet be filled to its specified capacity, indicating that more liquid needs to be added to the system. However, once the pressure and the liquid level have both reached a specified value, the control logic 1540 may determine that the filling operation is complete.

In still another embodiment, once information from a sensor or sensors indicates that the fluid conditioning unit 1500 may be full, the control logic 1540 may wait for a period of time to determine whether that information changes or remains sufficiently constant. For example, a pressure reading may temporarily match a threshold but drop below the threshold as gas bubbles or pockets move past the sensor, indicating that the system is not yet full.

The control logic 1540 may be configured to operate the pumps 1520 and the fill pump 1560 during a filling operation. For example, the control logic 1540 may start the fill pump 1560 until the sensor 1573 indicates that a specified liquid level or mass is reached in the reservoir 1510. The control logic 1540 may then stop the fill pump 1560 and start one or more of the pumps 1520 briefly. The pumps may be started and stopped one at a time, or in parallel. The control logic 1540 may start a pump 1520 for a time period that pumps liquid from the reservoir but does not cause the pump to overheat. That time period may be dependent on the specification of a given pump. Examples of the time frame may be on the order of less than a minute, e.g., 5, 10, 25, 30, 40, or 55 seconds, to about 1-3 minutes, e.g., 1.5 minutes, 2.25 minutes.

In an embodiment, once sensor information, e.g., from the sensors 1570, indicates that the pumps 1520 are liquid-filled, even if the conduits downstream from the pumps are not completely filled, the control logic 1540 may allow the pumps 1520 to run continuously until other sensor information indicates that the fluid conditioning unit 1500 is filled.

The control logic 1540 may continuously receive sensor information pushed from the sensors, or may request and pull information at specific intervals, e.g., every 2 seconds or every 10 seconds, or after specific events, such as, for example, after a pump has been "bumped".

In some embodiments, the fluid conditioning unit 1500 may include valves 1582 at the outlet(s) of the reservoir 1510. The valves 1582 may be one-way valves that allow liquid to leave the reservoir at the outlets, but do not allow liquid to enter the reservoir at the outlets. The fluid conditioning unit 1500 may also include a valve 1584 and a bypass conduit that allows liquid from the pumps to return to the reservoir, for example, when an outlet from the pump is blocked, a condition referred to as a "dead head." A dead-headed pump, if allowed to continue to pump, may heat the liquid trapped within it, eventually damaging the pump. If the inlet(s) to the heat exchanger 1530 are blocked, for example, the valve 1584 may be opened to allow the liquid from the pumps to return to the reservoir Referring again to FIG. 1C, a block diagram of a liquid-cooled heat exchange system having a fluid conditioning unit 1600 as may be used in a rack to cool servers in the rack is shown. The fluid conditioning unit 1600 can be mounted in a rack, or fluidically coupled to a rack, and may circulate cooling liquid among a plurality of rack-mounted server systems. The fluid conditioning unit 1600 may further facilitate transfer of the heat absorbed from the servers to another coolant, e.g., facility water. Some rack-mountable server systems include a rack 1650 holding a plurality of independently operable servers (not shown). The liquid-cooled heat exchange system can have a plurality of branches, where a branch can be configured to convey a liquid, e.g., a coolant, from an inlet to the branch to an outlet from the branch. The inlet and the outlet can be fluidly coupled with a liquid supply, such as a distribution manifold 1652, and a liquid collector, e.g., a collection manifold 1654, respectively. A given branch may convey the liquid to a heat transfer element thermally coupled to one or more heat dissipating devices, e.g., memory, chipsets, microprocessors, hard drives, etc. Heat from the heat dissipating device is transferred from the device to the liquid passing through the heat transfer element. The heated liquid exits the branch at the outlet. A branch may cool one or more heat dissipating devices in one server on the rack. For example, a given server may have more than one processing unit that needs to be cooled during operation, and a corresponding heat transfer element can have one heat-transfer module for each processing unit in the server. The distribution manifold 1652 and the collection manifold 1654 may be integral to the rack or may be separate and couplable to the rack. Examples of a liquid-cooled heat exchange system used to cool servers in a rack are disclosed in commonly-owned U.S. Pat. No. 9,496,200, which is incorporated by reference herein in its entirety.

The fluid conditioning unit 1600 may be installed on or in the rack 1650, e.g., generally as depicted in FIG. 1A. Alternatively, the conditioning unit may be a stand-alone conditioning unit fluidically coupled with a plurality of rack mounted servers. In either arrangement, the unit 1600 may operate to cool the liquid from the collection manifold 1654. For example, warm liquid from the collection manifold 1654 may enter the reservoir 1610 and be pumped from the reservoir to a heat exchanger 1630 by one or more pumps 1620. The heat exchanger 1630 may be, for example, a plate heat exchanger, a cross-flow or a counterflow liquid-liquid heat exchanger. The heat exchanger 1630 may receive chilled system liquid, e.g., chilled water, through an inlet conduit 1632 from an external environment heat exchanger 1660. The heat exchanger 1630 transfers heat from the warm liquid received from the reservoir to the chilled system liquid from the environmental heat exchanger 1660. The warmed system liquid returns to the environmental heat exchanger 1660 at the outlet 1634. The environmental heat exchanger 1660 may then transfer the heat from the system liquid to the environment or to another heat-transfer system.

Alternatively, the heat exchanger 1630, or an additional heat exchanger, may be positioned between the collection manifold and the reservoir, to cool the liquid as it leaves the collection manifold, before it is returned to the reservoir or to other system components (not shown).

The now-cooled liquid within the closed loop in the heat exchanger 1630 may be conveyed to the distribution manifold 1652 ready to be used to cool components within the branches.

In an embodiment, the branches of the liquid-cooled heat exchange system that are within the rack 1650 may be delivered to a site already filled with the cooling liquid. The collection and distribution manifolds may also be pre-filled. In these embodiments, the fluid conditioning unit 1600 may be used to fill the reservoir 1610, pumps 1620, the heat exchanger 1630, and the conduits therebetween without having to fill the rack or manifolds.

In still another embodiment, the fluid conditioning unit 1600 may be used to fill the liquid conduits and other heat exchange system components of the rack 1650, the distribution manifold 1652, and/or the collection manifold 1654. In such an embodiment, the control logic 1640 may receive information from sensors positioned in one or more of the rack 1650, the distribution manifold 1652, and/or the collection manifold 1654 to determine when the system components are filled. The control logic 1640 may control pumps within the rack 1650 directly, or indirectly via control logic that may be present within the rack, to "bump" them during an initial filling operation as described above.

Figure 17:
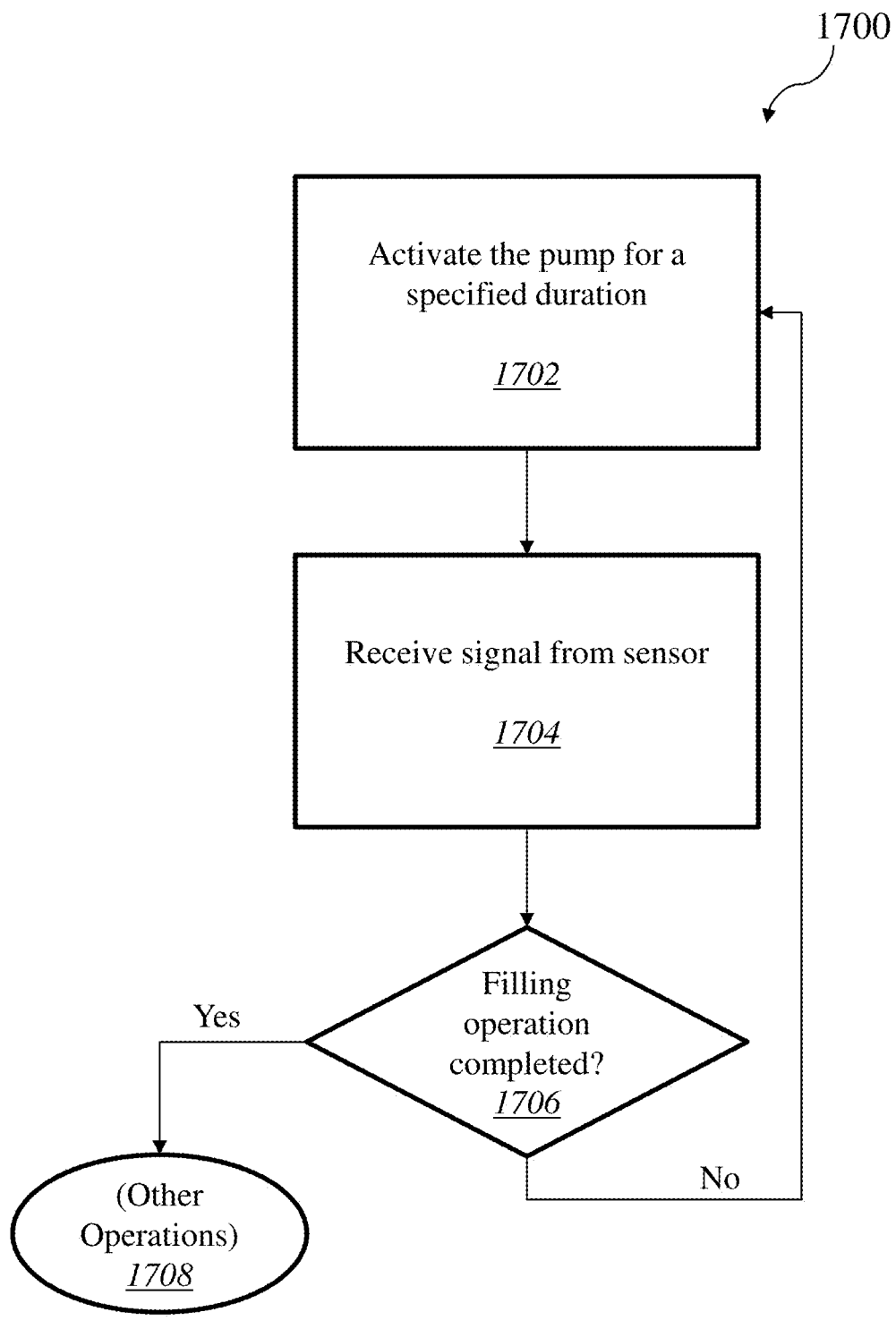
FIG. 17 shows a logic flow diagram that may be executed by control logic in a closed-loop liquid system having a pump, during an initial filling operation.

FIG. 17 shows a logic flow diagram 1700 such as one that may be executed by the control logic 1440, 1540, or 1640 in a fluid conditioning unit having a pump, during an initial filling operation.

In an embodiment, the logic flow 1700 may activate a pump for a specified duration in block 1702, e.g., a pump 1420, 1520, or 1620. The control logic may turn the pump on, e.g., with a switch, or may start the pump motor such that the motor pumps fluid from the reservoir. Initially, the fluid may be gas present in the conduit connecting the pump to the reservoir. The control logic may then stop the motor, turn the pump off, or otherwise prevent the pump from pumping after specified duration. Generally, the specified duration may be a brief period, for example and without limitation, on the order of less than a minute, e.g., 5, 10, 25, 30, 40, or 55 seconds, to about 1-3 minutes, e.g., 1.25 minutes, 2.75 minutes.

The logic flow 1700 may receive a signal from a sensor in block 1704. The control logic may pull information from a sensor, or may retrieve sensor information pushed from a sensor from a memory or a communication bus.

The logic flow 1700 may determine whether the filling operation is completed in block 1706, e.g., whether the system is "filled" or whether there is "enough" liquid in the system to permit the pumps to run continuously. In reference to a filling operation, the terms "enough," "sufficient," or "filled" may refer to an amount of liquid such that all of the liquid conduits and fluidically coupled components in at least the fluid conditioning unit, such as, for example, pumps and heat exchangers, or in the entire closed-loop system between the outlet and the inlet of the reservoir, contain liquid and only a negligible amount of gas. The reservoir itself may contain liquid to a specified level, with some amount of gas. Alternatively, the terms may refer to an amount of liquid in the pumps and upstream from the pumps such that the pumps can operate continuously without over-heating.

Returning to block 1706, in an embodiment, the control logic may compare the received sensor information to a threshold value. When the sensor information meets a threshold indicating sufficient liquid, then the control logic may determine that there is enough liquid in the system and that the system is filled. In another embodiment, the control logic may use the sensor information to calculate a second value, for example, as a function of the sensor information, to determine if the system contains enough liquid. For example, and without limitation, a sensor may provide a volume reading of the liquid, and the control logic may calculate a pressure based on the volume and then compare the pressure to a threshold. The calculation of a second value may use information from other sensors, depending on the variables of the function.

Additionally, or alternatively, the control logic may determine whether the filling operation is completed based on information from more than one sensor, and/or from information from a sensor obtained at different times.

When the filling operation is not completed, the logic flow 1700 may repeat, beginning at block 1702. When the filling operation is completed, the logic flow 1700 may perform other operations at block 1708. For example, a fill pump and/or the pumps 1420, 1520, 1620 may be deactivated, the fluidic coupling between the fill pump and the reservoir may be decoupled, and/or the communication coupling between the control logic and the fill pump may be decoupled.
Self-Diagnosis As yet another example, the second value may be a value of a thermodynamic state variable for a given substance in the system (e.g., a coolant flowing among the various components in any of the heat transfer systems described herein). A number of sensors arranged throughout the system may measure selected physical characteristics of, for example, a coolant flowing among a plurality of rack mounted servers and a fluid conditioning unit. A number of other sensors arranged throughout, e.g., a rack of servers, also may measure selected physical characteristics of components that interact with the heat transfer system. Such characteristics may include, without limitation, processor power dissipation (e.g., energy per unit time). A physical model may describe an inter-relation between or among such physical characteristics, as through an equation of state. Consequently, measurements of selected physical quantities by selected sensors can be input into a model (e.g., an equation of state) and that model can predict values of selected physical quantities, e.g., at a selected position within the heat-transfer system.

Control logic can implement such modeling technologies.

Predictions of selected physical quantities can be compared to measurements of those physical quantities. If the prediction falls within a selected threshold difference from the measured quantity (or vice-versa), the sensor that observed the measured quantity may be assumed to be in good working order. However, a failing or a failed sensor may be identified if the prediction differs from the measured quantity by more than a selected threshold difference. For example, one of the sensors used to generate the prediction and/or the sensor used to observe the physical quantity to which the prediction is compared may be faulty. By inputting a quantity measured by a faulty sensor to an equation of state or a comparison to a predicted value of a state variable, the predicted value and the measured value likely will differ by more than a selected threshold difference. Such a difference may give rise to a presumption that a sensor is faulty. Further comparison among predicted and observed values throughout the system can be used to identify which sensor(s) may be faulty. Control logic can implement such comparison technologies.

Prediction and comparison technologies described herein can allow system components, including, by way of example and not limitation, fluid conditioning units to "self diagnose" system and component health. For example, a failing pump, a leak, an excessive heat-dissipation, a poor thermal coupling, and any of a variety of other system degradations or faults may be identified with techniques described herein. Control logic can implement such self-diagnosis technologies. Moreover, when a fault or other degradation is determined, control or other logic can emit a flag or otherwise emit an alert or other signal indicating the presence of the fault or other degradation.

By way of further explanation, an equation of state is a thermodynamic equation relating state variables of matter, which describe the state of a given substance under a given set of physical conditions. For example, pressure (p), volume (V), and temperature (T) are state variables, as is internal energy. Many state variables are known, and each quantifies a respective characteristic of matter throughout the various thermodynamic states of that matter. In general, equations of state are useful for describing properties of matter, including fluids, mixtures of fluids, and solids.

As a general principle, pressure, volume and temperature for a given amount of matter are not independent of each other. Rather, they are linked by a relationship generally of the form $f(p,V,T)=0$. An equation used to model that relationship is generally referred to in the art as an equation of state.

Many equations of state have been developed and may be used in connection with technologies described herein. One useful equation of state used to model so-called "incompressible liquids" is V=constant. Stated differently, the general form of the equation of state can be reduced to a two-variable equation of state: $f(p,T)=0$ when the volume of a given substance (e.g., an "incompressible" liquid) remains constant, or approximately constant over a selected range of temperatures and a selected range of pressures. Coolants of the type described herein, in their liquid phase, typically can be reliably modeled as being incompressible. Nonetheless, technologies described herein are not limited solely to incompressible liquids. Rather, technologies described herein can be applied to incompressible and compressible fluids, and saturated mixtures thereof, as well as solids and saturated solid-liquid mixtures.

For example, a variety of temperature, flow-rate, and/or pressure sensors can be arranged within any of the heat-transfer systems (and components thereof) described herein. Such sensors can be arranged to observe, for example, temperature, flow-rate and pressure (e.g., static and/or stagnation) at one or more selected locations within a fluid circuit (open or closed), or any other physical characteristic pertaining to a thermodynamic state of a substance in the heat-transfer system. A controller (e.g., control logic) can adjust operation of one or more coolant (e.g., a pump, a valve) and/or heat-transfer components (e.g., a logic or other component of a computing environment) to achieve desired flow and/or cooling characteristics within the heat-transfer system.

As another example, measurement of observable state-variables (e.g., temperature, static pressure, mass, density) combined with known measures of selected properties (e.g., specific heat, heat capacity, compressibility, gas constant, equation-of-state) of a given fluid and/or observable system performance characteristics (e.g., power dissipation from a heat source), health and robustness of system sensors can be assessed and communicated to a system user or manager. For example, some disclosed systems, controllers and methods can compute values of state variables at one or more selected locations within a selected fluid circuit (or branch thereof) and compare the computed value to an observed value detected from a given sensor.

Figure 18:
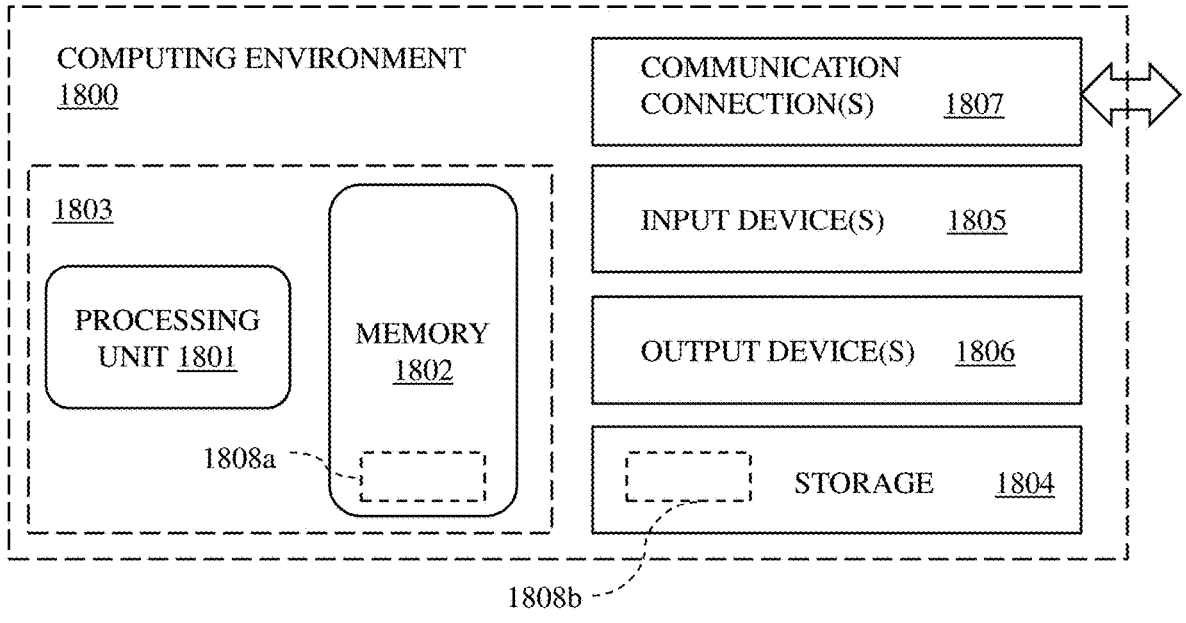
FIG. 18 illustrates a generalized example of a suitable computing environment for implementing one or more technologies described herein.

If an absolute value of a difference between the computed value and the observed value exceeds a selected threshold difference, an innovative system, controller or method can determine a fault has occurred and can take a remedial action, as by setting a flag, sending an e-mail, and/or initiating an alarm to alert a user of the determined fault. Such a fault can indicate a failed or failing sensor, a leak, an over temperature condition, a failed pump, an under-speed pump, an over-speed pump, a failed or failing controller Computing Environments FIG. 18 illustrates a generalized example of a suitable computing environment 1800 in which described methods, embodiments, techniques, and technologies relating, for example, to control of a filling operation and other system control for a liquid-filled closed loop system. The computing environment 1800 is not intended to suggest any limitation as to scope of use or functionality of the technologies disclosed herein, as each technology may be implemented in diverse general-purpose or special-purpose computing environments. For example, each disclosed technology may be implemented with other computer system configurations, including wearable and handheld devices, multiprocessor systems, microprocessor-based or programmable consumer electronics, embedded platforms, network computers, mini-computers, mainframe computers, smartphones, tablet computers, data centers, audio devices, and the like. Each disclosed technology may also be practiced in distributed computing environments where tasks are performed by remote processing devices that are linked through a communications connection or network. In a distributed computing environment, program modules may be located in both local and remote memory storage devices.

The computing environment 1800 includes at least one central processing unit [[1810]] 1801 and memory 1802. In FIG. 18, this most basic configuration 1803 is included within a dashed line and may represent the control logic, e.g., control logic 1440, 1540, or 1640. The central processing unit [[1810]] 1801 executes computer-executable instructions and may be a real or a virtual processor. In a multi-processing system, multiple processing units execute computer-executable instructions to increase processing power and as such, multiple processors can run simultaneously. The memory 1802 may be volatile memory (e.g., registers, cache, RAM), non-volatile memory (e.g., ROM, EEPROM, flash memory, etc.), or some combination of the two. The memory 1802 stores software 1808a that can, for example, implement one or more of the innovative technologies described herein, when executed by a processor.

A computing environment may have additional features. For example, the computing environment 1800 may include storage 1804, one or more input devices 1805, one or more output devices 1806, and one or more communication connections 1807. An interconnection mechanism (not shown) such as a bus, a controller, or a network, interconnects the components of the computing environment 1800. Typically, operating system software (not shown) provides an operating environment for other software executing in the computing environment 1800, and coordinates activities of the components of the computing environment 1800.

The store 1804 may be removable or non-removable, and can include selected forms of machine-readable media. In general, machine-readable media include magnetic disks, magnetic tapes or cassettes, non-volatile solid-state memory, CD-ROMs, CD-RWs, DVDs, magnetic tape, optical data storage devices, and carrier waves, or any other machine-readable medium which can be used to store information, and that can be accessed within the computing environment 1800. The storage 1804 stores instructions for the software 1808b, which can implement technologies described herein.

The storage 1804 can also be distributed over a network so that software instructions are stored and executed in a distributed fashion. In other embodiments, some of these operations might be performed by specific hardware components that contain hardwired logic. Those operations might alternatively be performed by any combination of programmed data processing components and fixed hardwired circuit components.

The input device(s) 1805 may be a touch input device, such as a keyboard, keypad, mouse, pen, touchscreen, touch pad, or trackball, a voice input device, a scanning device, or another device, that provides input to the computing environment 1800.

The output device(s) 1806 may be a display, printer, speaker transducer, DVD-writer, or another device that provides output from the computing environment 1800.

The communication connection(s) 1807 enable communication over a communication medium (e.g., a connecting network) to another computing entity. The communication medium conveys information such as computer-executable instructions, compressed graphics information, processed signal information (including processed audio signals), or other data in a modulated data signal.

Thus, disclosed computing environments are suitable for performing disclosed orientation estimation and audio rendering processes as disclosed herein.

Machine-readable media are any available media that can be accessed within a computing environment 1800. By way of example, and not limitation, with the computing environment 1800, machine-readable media include memory 1802, storage 1804, communication media (not shown), and combinations of any of the above. Tangible machine-readable (or computer-readable) media exclude transitory signals.

As explained above, some disclosed principles can be embodied in a tangible, non-transitory machine-readable medium (such as microelectronic memory) having stored thereon instructions, which program one or more data processing components (generically referred to here as a "processor") to perform the digital signal processing operations of the control logic described above including estimating, adapting, computing, calculating, measuring, adjusting, sensing, measuring, filtering, addition, subtraction, inversion, comparisons, and decision making. In other embodiments, some of these operations (of a machine process) might be performed by specific electronic hardware components that contain hardwired logic (e.g., dedicated digital filter blocks). Those operations might alternatively be performed by any combination of programmed data processing components and fixed hardwired circuit components.

Other Exemplary Embodiments

Directions and references (e.g., up, down, top, bottom, left, right, rearward, forward, etc.) may be used to facilitate discussion of the drawings and principles herein, but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. As used herein, "and/or" means "and" or "or", as well as "and" and "or." Moreover, all patent and non-patent literature cited herein is hereby incorporated by references in its entirety for all purposes.

The principles described above in connection with any particular example can be combined with the principles described in connection with any one or more of the other examples. Accordingly, this detailed description shall not be construed in a limiting sense, and following a review of this disclosure, those of ordinary skill in the art will appreciate the wide variety of cooling systems, controllers and methods that can be devised using the various concepts described herein. Moreover, those of ordinary skill in the art will appreciate that the exemplary embodiments disclosed herein can be adapted to various configurations without departing from the disclosed principles.

For example, a disclosed system can include an enclosure having an inlet to the enclosure and a wall at least partially defining a boundary of the enclosure. The enclosure can be configured to receive a liquid from the inlet and to contain the received liquid. An aperture can extend through the wall. A conduit can be coupled with the aperture, and the conduit can include a segment extending into the enclosure from the aperture. A baffle can define a corresponding plurality of apertures. The baffle can be positioned between the inlet and the segment of the conduit, and the baffle can be oriented such that liquid received from the inlet passes through the plurality of apertures in the baffle before entering the segment of conduit.

Each in the plurality of apertures in the baffle can be circular or polygonal.

The baffle can include one or more of a screen, a mesh, and an expanded-metal panel.

The baffle can be oriented transversely relative to the wall. For example, the baffle can be oriented orthogonally of a flow direction between the inlet and the segment of conduit. The baffle can be so oriented relative to a bulk flow direction between the inlet and the segment of conduit as to turn a direction of flow adjacent the baffle. In some embodiments, the baffle is curved, and in others the baffle is substantially planar.

The baffle can extend from a height above a maximum liquid level of the tank toward the bottom of the tank without contacting the bottom of the tank.

The system can also include a pump and conduit fluidly coupling the pump with the aperture in the wall. The aperture in the wall can be a first aperture, and the inlet can be a second aperture in the wall.

Other system arrangements are possible. For example, a system can include a sealed tank having a top, a bottom, and a side wall. The tank can be configured to receive a liquid from an inlet and to hold the liquid. A wall aperture can extend through the side wall. A liquid conduit can be coupled with the wall aperture at a first conduit aperture. The liquid conduit can define a second conduit aperture inside the tank. The liquid conduit can also include a bend, such that a first distance from the bottom of the tank to the second conduit aperture is smaller than a second distance from the bottom of the tank to a bottom edge of the wall aperture.

A plane of the second conduit aperture can be parallel to the bottom of the tank. The liquid conduit can be perpendicular to the side wall at the wall aperture.

A baffle can have a plurality of apertures. Each aperture can have a hydraulic diameter. The baffle can be positioned between the inlet and the second conduit aperture and the baffle can be oriented so that the liquid received from the inlet passes through the plurality of apertures in the baffle before exiting the tank at the second conduit aperture.

A control system can include control logic comprising a processing unit and instructions stored on a memory that, when executed by the processing unit, cause the control logic to perform selected actions. Such actions can be combined. For example, the control logic can communicate a control signal to a pump in a fluid conditioning unit. The control logic can receive a signal from a sensor in the fluid conditioning unit. The control logic can iteratively activate and deactivate the pump via the control signal until the signal received from the sensor comprises an indication that the fluid conditioning unit is filled with a liquid to a specified amount.

The control logic can activate the pump for a duration of less than one minute, or about 1-3 minutes. The signal from the sensor can include a value of an observational parameter. The control logic can compare the value of the observational parameter to a programmed value to determine whether the signal comprises the indication.

The operational parameter can be at least one of: a temperature, a pressure, a flow rate, a pump speed, a mass, a fluid level, a fluid volume, a load on a pump, a specific volume, an enthalpy, a specific heat, and a combination thereof.

The control logic can calculate a value as a function of the value of the observational parameter to determine whether the signal comprises the indication.

The control logic can communicate a second control signal to a valve in the fluid conditioning unit. The valve can be configured to release gas from the fluid conditioning unit.

The control logic can open the valve via the second control signal responsive to the signal received from the sensor.

A system can include a reservoir defining an inlet and an outlet, and the reservoir can be configured to hold a liquid received from the inlet. The pump can have a pump outlet and a pump inlet, where the pump inlet is fluidically coupled to the reservoir outlet by a first liquid conduit. The pump can be configured to pump the liquid from the reservoir through the pump outlet to a second liquid conduit.

A fill tank can be configured to fluidically couple to the inlet of the reservoir; and a second pump can be configured to pump liquid from the fill tank to the reservoir.

The control signal to the pump can be a first control signal to the first pump, and the control logic can communicate a second control signal to the second pump.

The second liquid conduit can be fluidically coupled to a closed-loop liquid operational block.

The pump can be a first pump, and the system can further include at least one other pump having a corresponding pump inlet fluidically coupled to the reservoir and a pump outlet. Each of the pumps can be configured to pump the liquid from the reservoir through the corresponding pump outlet to a different liquid conduit.

The control logic can be configured to iteratively activate and deactivate each of the plurality of pumps.

The control logic can be configured to iteratively activate and deactivate each of the plurality of pumps sequentially.

The control logic is configured to iteratively activate and deactivate each of the plurality of pumps in concurrently or jointly.

A rack-mountable server system can include a manifold module having a distribution manifold and a collection manifold, with each manifold being configured to contain a liquid. A rack can be configured to receive a plurality of independently operable servers and can include a branch of a heat-transfer system configured to convey the liquid from an inlet to the branch to an outlet from the branch. The inlet can be fluidly couplable with the distribution manifold and the outlet can be fluidly couplable with the collection manifold. The branch can correspond with a first server of the plurality of servers, and each other server can have a corresponding branch of the heat-transfer system having an inlet fluidly coupled to the distribution manifold and an outlet fluidly coupled to the collection manifold. The rack-mountable server system can also include a a fluid conditioning unit. The fluid conditioning unit can include a reservoir configured to receive the liquid via an inlet fluidically couplable to the collection manifold and to hold the liquid. A heat exchange component can be fluidically couplable to the distribution manifold. A pump can be coupled to the reservoir with a first liquid conduit, and the pump can be configured to pump the liquid from the reservoir to the heat exchange component. A sensor can be configured to observe an operational parameter in the system. The system can also include control logic configured to communicate a control signal to the pump; receive a signal from the sensor; and iteratively activate and deactivate the pump via the control signal until the signal received from the sensor comprises an indication that the fluid conditioning unit is filled with a liquid to a specified amount.

The control logic can also be configured to iteratively activate and deactivate the pump via the control signal until the signal received from the sensor comprises an indication that the manifold module is filled with the liquid to a specified amount.

The control logic can be configured to iteratively activate and deactivate the pump via the control signal until the signal received from the sensor comprises an indication that the branches of the heat-transfer system are filled with the liquid to a specified amount.

The previous description of the disclosed embodiments is provided to enable any person skilled in the art to make or use the disclosed innovations. Those of ordinary skill in the art will appreciate that the exemplary embodiments disclosed herein can be adapted to various configurations and/or uses without departing from the disclosed principles. For example, the principles described above in connection with any particular example can be combined with the principles described in connection with another example described herein. Various modifications to those embodiments will be readily apparent to those skilled in the art, and the generic principles defined herein may be applied to other embodiments without departing from the spirit or scope of this disclosure. Accordingly, this detailed description shall not be construed in a limiting sense, and following a review of this disclosure, those of ordinary skill in the art will appreciate the wide variety of filtering and computational techniques can be devised using the various concepts described herein.

Similarly, the presently disclosed inventive concepts are not intended to be limited to the embodiments shown herein, but are to be accorded their full scope consistent with the principles underlying disclosed concepts, wherein reference to an element in the singular, such as by use of the article "a" or "an" is not intended to mean "one and only one" unless specifically so stated, but rather "one or more". All structural and functional equivalents to the elements of the various embodiments described throughout the disclosure that are known or later come to be known to those of ordinary skill in the art are intended to be encompassed by the features described and claimed herein. Moreover, nothing disclosed herein is intended to be dedicated to the public regardless of whether such disclosure may ultimately explicitly be recited in the claims. No element or concept disclosed herein or hereafter presented shall be construed under the provisions of 35 USC 112(f) unless the element or concept is expressly recited using the phrase "means for" or "step for".

Thus, in view of the many possible embodiments to which the disclosed principles can be applied, we reserve the right to claim any and all combinations of features and acts described herein, including the right to claim all that comes within the scope and spirit of the foregoing description, as well as the combinations recited, literally and equivalently, in the following claims and any claims presented anytime throughout prosecution of this application or any application claiming benefit of or priority from this application.

We currently claim:

1. A system comprising:
   a reservoir defining an inlet and an outlet, and configured to hold a liquid received from the inlet;
   a pump fluidically coupled to the reservoir and configured to pump the liquid from the reservoir to a fluid conditioning unit;
   a sensor configured to observe an operational parameter; and
   control logic configured to:
      communicate a control signal to the pump;
      receive a signal from the sensor; and
      iteratively activate and deactivate the pump via the control signal until the signal received from the sensor comprises an indication that the fluid conditioning unit is filled with a liquid to a specified amount; and
   a fill tank fluidically coupled to the reservoir; and
   a second pump configured to pump liquid from the fill tank to the reservoir;
   wherein the control logic is configured to communicate a second control signal to the second pump to activate and deactivate the second pump.

2. The system of claim 1, wherein the sensor comprises a temperature sensor, a pressure sensor, a liquid detection sensor, a flow sensor, or a fluid level sensor.

3. The system of claim 1, comprising a plurality of pumps fluidically coupled to the reservoir, each of the plurality of pumps configured to pump the liquid from the reservoir to the closed-loop liquid system.

4. The system of claim 3, wherein the control logic is configured to iteratively activate and deactivate each of the plurality of pumps.

5. The system of claim 4, wherein the control logic is configured to iteratively activate and deactivate each of the plurality of pumps sequentially.

6. The system of claim 4, wherein the control logic is configured to iteratively activate and deactivate each of the plurality of pumps concurrently.

7. A system according to claim 1, further comprising:
   a baffle defining a corresponding plurality of apertures, wherein the baffle is positioned in the reservoir between the inlet and the outlet, wherein the baffle is oriented such that liquid received from the inlet passes through the plurality of apertures in the baffle before flowing through the outlet.

8. The system of claim 7, wherein the system further comprises a segment of conduit extending into the reservoir, the segment of conduit defining an arcuate segment such that an end of the segment of conduit is positioned lower, relative to gravity, than a centroid of the outlet.

9. The system of claim 8, wherein the segment of the conduit defines an end positioned distally from the outlet, wherein the end defines an aperture and wherein the aperture is oriented transversely relative to the outlet.

10. The system of claim 8, wherein the segment of the conduit defines an end positioned distally from the outlet, wherein the end defines an aperture and wherein the aperture is oriented transversely relative to the baffle.

11. The system of claim 7, wherein the baffle is a first baffle and the corresponding plurality of apertures is a first plurality of apertures, wherein the system further comprises a second baffle defining a second plurality of apertures.

12. The system of claim 11, wherein each of the first plurality of apertures and the second plurality of apertures has a corresponding hydraulic diameter characteristic of the respective plurality of apertures, wherein the hydraulic diameter characteristic of the first plurality of apertures differs from the hydraulic diameter characteristic of the second plurality of apertures.

13. The system of claim 12, wherein the baffles are arranged in order of decreasing hydraulic diameter along a direction extending from the inlet to the conduit segment.

14. The system of claim 11, wherein a hydraulic diameter characteristic of the first plurality of apertures is substantially equal of a hydraulic diameter characteristic of the second plurality of apertures.

15. The system of claim 11, wherein the plurality of apertures of the first baffle is offset from the plurality of apertures of the second baffle.

* * * * *